(12) United States Patent
Sukekawa et al.

(10) Patent No.: US 11,569,185 B2
(45) Date of Patent: Jan. 31, 2023

(54) SEMICONDUCTOR DEVICE AND METHOD OF FORMING THE SAME

(71) Applicant: MICRON TECHNOLOGY, INC., Boise, ID (US)

(72) Inventors: Mitsunari Sukekawa, Hiroshima (JP); Shogo Omiya, Higashihiroshima (JP); Yasutaka Iuchi, Higashihiroshima (JP); Yoshinori Ikebuchi, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 17/074,175

(22) Filed: Oct. 19, 2020

(65) Prior Publication Data

US 2022/0122930 A1 Apr. 21, 2022

(51) Int. Cl.
   *H01L 23/48* (2006.01)
   *H01L 23/52* (2006.01)
   *H01L 29/40* (2006.01)
   *H01L 23/00* (2006.01)

(52) U.S. Cl.
   CPC ............. *H01L 24/05* (2013.01); *H01L 24/03* (2013.01); *H01L 24/08* (2013.01); *H01L 24/80* (2013.01); *H01L 2224/03848* (2013.01); *H01L 2224/05176* (2013.01); *H01L 2224/08145* (2013.01); *H01L 2224/80895* (2013.01); *H01L 2224/80896* (2013.01); *H01L 2924/01044* (2013.01); *H01L 2924/0478* (2013.01); *H01L 2924/13091* (2013.01); *H01L 2924/1436* (2013.01)

(58) Field of Classification Search
   CPC combination set(s) only.
   See application file for complete search history.

(56) References Cited

U.S. PATENT DOCUMENTS

| | | | | |
|---|---|---|---|---|
| 2008/0258233 A1* | 10/2008 | Hsiao | ............. | H01L 21/823864 257/382 |
| 2010/0267232 A1* | 10/2010 | Shih | ................. | H01L 21/76846 257/E21.585 |

* cited by examiner

*Primary Examiner* — Niki H Nguyen
(74) *Attorney, Agent, or Firm* — Dorsey & Whitney LLP

(57) ABSTRACT

A method for forming a multilayer conductive structure includes forming a first conductive portion; forming a second conductive portion containing ruthenium (Ru) therein on the first conductive portion; forming a third conductive portion on the second conductive portion; and performing a silicidation process on the second conductive portion.

19 Claims, 27 Drawing Sheets

SEMICONDUCTOR DEVICE AND METHOD OF FORMING THE SAME

BACKGROUND

In a hybrid bonding process for bonding wafers to each other, normally copper (Cu) plugs are used. However, if copper is used in layers near the silicon, device performance is degraded due to copper contamination in some cases. Also, with hybrid bonding, because the expansion of Cu is used to bond the copper plugs to each other, the plug height needs to be approximately 500 nm. For this reason, processing is difficult with fine contacts.

In some cases, tungsten (W) is used for the digit line in dynamic random access memory (DRAM) In these cases, if further miniaturization is pursued, it is anticipated that the necessary low resistance may not be obtained with tungsten due to the thin-wire effect. Accordingly, the use of ruthenium (Ru), which has a lower resistance and a smaller thin-wire effect than tungsten, is being investigated. However, because a heat treatment is performed after drilling holes for the contacts to lower the resistance of the contacts on a silicon substrate that is formed at the same time as the contacts on the digit line, ruthenium aggregates inside the contact spaces before the contact material is buried, and as a result, discontinuities in the ruthenium may occur near the contacts in some cases.

BRIEF DESCRIPTION OF THE DRAWINGS

FIGS. 4 to 9 are diagrams that sequentially illustrate an example of the schematic configuration in exemplary process stages. FIG. 4 is a plan view. FIGS. 5 to 9 are longitudinal sections illustrating an example of the schematic configuration of the portion along the line B-B in FIG. 4.

FIGS. 10 to 13 are diagrams that sequentially illustrate an example of the schematic configuration in exemplary process stages, and are longitudinal sections illustrating an example of the schematic configuration of the portion along the line B-B in FIG. 4.

FIGS. 14 to 17 are diagrams that sequentially illustrate an example of the schematic configuration in exemplary process stages, and are longitudinal sections illustrating an example of the schematic configuration of the portion along the line B-B in FIG. 4.

FIGS. 19 to 22 are diagrams that sequentially illustrate an example of the schematic configuration in exemplary process stages.

FIGS. 23 to 25 are diagrams that sequentially illustrate an example of the schematic configuration in exemplary process stages.

FIGS. 26 and 27 are diagrams that sequentially illustrate an example of the schematic configuration in exemplary process stages.

FIGS. 29 to 31 are diagrams that sequentially illustrate an example of the schematic configuration in exemplary process stages, and are longitudinal sections illustrating an example of the schematic configuration of the portion along the line J-J in FIG. 28.

FIGS. 32 and 33 are diagrams that sequentially illustrate an example of the schematic configuration in exemplary process stages, and are longitudinal sections illustrating an example of the schematic configuration of the portion along the line J-J in FIG. 28.

DETAILED DESCRIPTION

Figure 1:
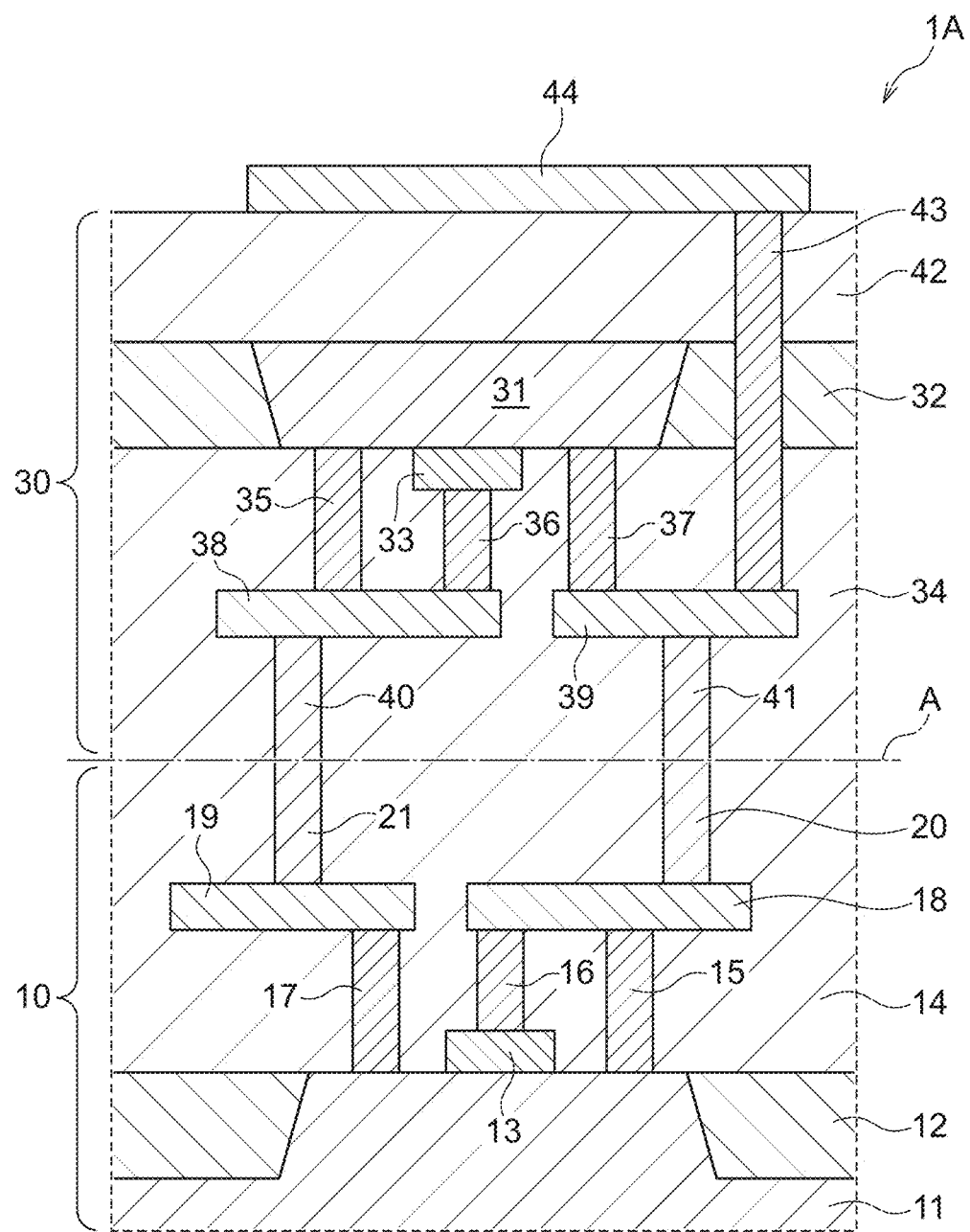
FIG. 1 is a diagram for explaining a semiconductor device according to first, second, and third embodiments, and is a longitudinal section illustrating an example of a schematic configuration of a complementary metal-oxide semiconductor (CMOS) device having a hybrid bonding structure.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

In the semiconductor device according to the plurality of embodiments, a third conductive portion disposed between a first conductive portion and a second conductive portion is provided with a structure that contains ruthenium silicide (RuSi) fully or partially. A part of the third conductive portion that connects the first and second conductive portions may be ruthenium silicide, or the entire third conductive portion may be ruthenium silicide. The third conductive portion may be wires, contacts, plug electrodes, or some other type of conductive portion.

The third conductive portion that connects the first and second conductive portions may also contain silicon (Si), titanium (Ti), titanium nitride (TiN), or some other conductive material. Also, the third conductive portion may be wires, contacts, plug electrodes, or some other type of conductive portion. In addition, a part of the wires, contacts, plug electrodes, or some other type of conductive portion may be treated as the first and second conductive portions, and all or part of the gap in between may be configured to contain ruthenium silicide. Also, a part of the wires may be treated as the first conductive portion while the contacts, plug electrodes, or some other type of conductive portion connecting to the wires may be treated as the second conductive portion, and all or part of the gap in between may be configured to contain ruthenium silicide.

In addition, during silicidation, the ruthenium (Ru) and the silicon react, and the volume expands when the ruthenium silicide is formed. By using the expansion of the ruthenium silicide to fill the gap with the ruthenium silicide, the gap can be electrically connected. In the stage before the ruthenium silicide is formed, the wires, contacts, plug electrodes, or some other type of conductive portion are provided with a gap, and in the case where an electrical discontinuity is formed because of the gap, silicidation may be performed to form ruthenium silicide and fill the gap.

When applied to hybrid bonding, after positioning the wafers, the members that form the electrodes or wires expand due to an annealing heat treatment, and with this arrangement, the electrodes or wires may be designed to cross the gap and contact each other, thereby causing the silicidation reaction to proceed. It may also be designed such that the gap is connected by expansion due to the formation of ruthenium silicide.

In addition, the electrodes or wires may be formed from ruthenium and configured such that ruthenium silicide is formed in advance with respect to a structure without a gap. By forming the ruthenium silicide in advance, aggregation due to the heat treatment can be suppressed, and a disconnection in the wires can be suppressed.

When forming the ruthenium silicide, ruthenium and silicon may be formed to be in contact with each other in advance, and ruthenium silicide may be formed by performing a heat treatment on the ruthenium and the silicon. Also, ruthenium may be formed on one side of the gap while silicon may be formed on the other side of the gap, and contact with the silicon may be achieved by the expansion of the ruthenium when a heat treatment is performed, thereby causing ruthenium silicide to be formed. Furthermore, the ruthenium silicide may be formed by supplying a gas containing silane, disilane, dichlorosilane, monochlorosilane, trichlorosilane, or some other type of silicon to the ruthenium.

First to Third Embodiments

A semiconductor device 1A to which the first to third embodiments are applied will be described with reference to FIGS. 1 to 3. In the following description, FIG. 1 is a longitudinal section illustrating an example of a schematic configuration of the semiconductor device 1A including a CMOS circuit formed by combining an NMOS transistor and a PMOS transistor.

FIG. 1 illustrates a schematic configuration of a part of the semiconductor device 1A. The semiconductor device 1A is formed by using hybrid bonding to bond a first conductive portion 10 and a second conductive portion 30 illustrated in FIGS. 2 and 3.

For example, a fusion bonding method is used to bond the wafers by hybrid bonding. In the fusion bonding method, first, a process of causing a large number of hydroxyl groups to adhere to the contact surfaces, or in other words a hydrophilization treatment, is performed.

Next, the contact surfaces that have been subjected to the hydrophilization treatment are superimposed and bonded together. The bonding according to the fusion bonding method is formed by hydrogen bonds between the hydroxyl groups on the hydrophilic surfaces. The bonding according to the fusion bonding method can be performed at room temperature. In the following description, the bonding by hybrid bonding is achieved using the fusion bonding method.

Figure 2:
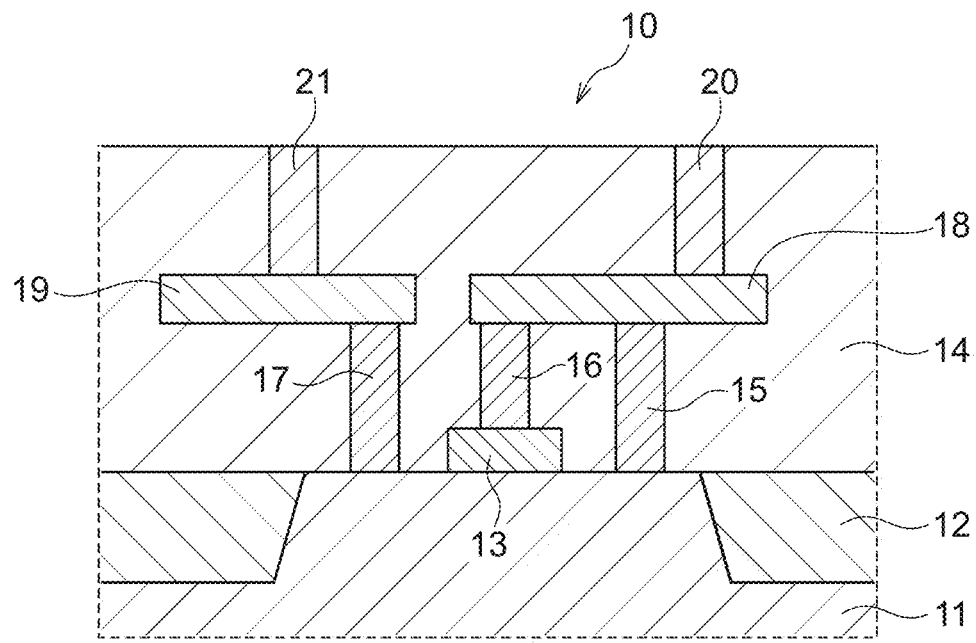
FIGS. 2 and 3 are longitudinal sections each illustrating an example of a schematic configuration of a first conductive portion and a second conductive portion before the bonding of the semiconductor device illustrated in FIG. 1.
Figure 3:
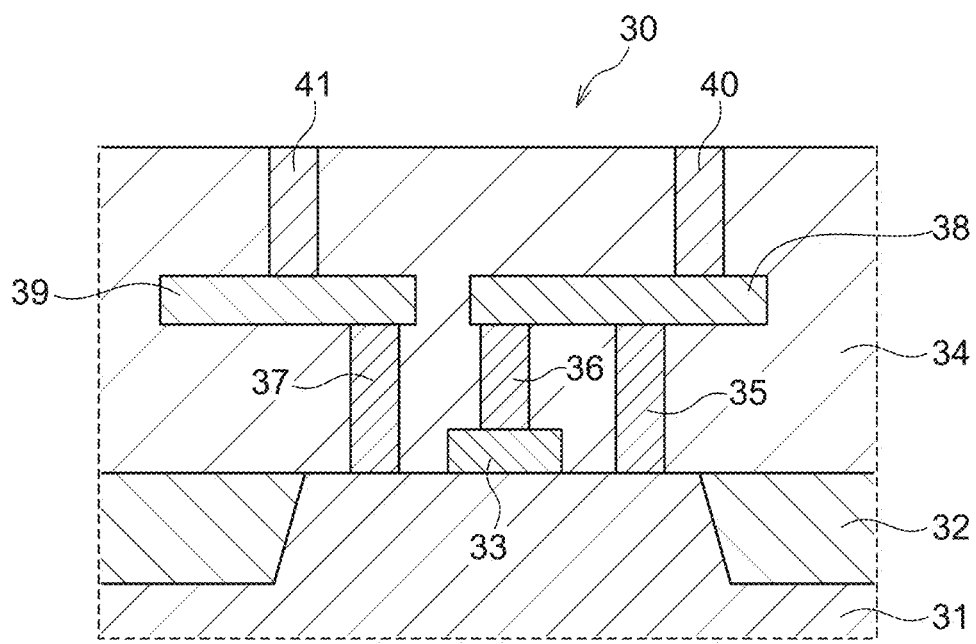

As illustrated in FIGS. 1, 2, and 3, the semiconductor device 1A is provided with the first conductive portion 10 and the second conductive portion 30. The first conductive portion 10 is a portion that includes the NMOS transistor, for example. The second conductive portion 30 is a portion that includes the PMOS transistor, for example.

The first conductive portion 10 is provided with a semiconductor substrate 11, an isolation 12 provided in the semiconductor substrate 11, and a gate electrode 13, contacts 15, 16, and 17, wires 18 and 19, and plugs 20 and 21 provided on the semiconductor substrate 11. The gate electrode 13, the contacts 15, 16, and 17, the wires 18 and 19, and the plugs 20 and 21 are covered by an insulating film 14 provided on the semiconductor substrate 11.

The semiconductor substrate 11 contains p-type single-crystal silicon, for example. The isolation 12 and the insulating film 14 contain an insulating material such as silicon dioxide ($SiO_2$), for example. The gate electrode 13 contains a conductive material such as polysilicon (poly-Si), tungsten nitride (WN), or tungsten (W), for example. An n-type source and drain not illustrated are provided in the semiconductor substrate 11 on either side of the gate electrode 13, and the gate electrode 13 functions as the gate electrode of the NMOS transistor.

The second conductive portion 30 is provided with a semiconductor substrate 31, an isolation 32 provided in the semiconductor substrate 31, and a gate electrode 33, contacts 35, 36, and 37, wires 38 and 39, and plugs 40 and 41 provided on the semiconductor substrate 31. The gate electrode 33, the contacts 35, 36, and 37, the wires 38 and 39, and the plugs 40 and 41 are covered by an insulating film 34 provided on the semiconductor substrate 31.

The semiconductor substrate 31 contains n-type single-crystal silicon, for example. The isolation 32 and the insulating film 34 contain an insulating material such as silicon dioxide, for example. The gate electrode 33 contains a conductive material such as polysilicon, tungsten nitride, or tungsten, for example. A source and drain not illustrated are provided in the semiconductor substrate 31 on either side of the gate electrode 33, and the gate electrode 33 functions as the gate electrode of the PMOS transistor.

The first conductive portion 10 and the second conductive portion 30 are brought into contact and bonded together by hybrid bonding such that the top faces of the insulating film 14 and the insulating film 34, the end faces of the plug 20 and the plug 41, and the end faces of the plug 21 and the plug 40 butt each other. In FIG. 1, the second conductive portion 30 is illustrated in an upside-down state relative to the state illustrated in FIG. 3.

In FIG. 1, an insulating film 42 is provided on top of the semiconductor substrate 31 and the isolation 32. A wire 44 is provided on top of the insulating film 42, and the bottom face of the wire 44 and the top face of the insulating film 34 are connected by a through-hole 43.

The contacts 15, 16, 17, 35, 36, and 37 are formed to contain a conductive material such as titanium nitride (TiN) or tungsten, for example. The wires 18, 19, 38, and 39 contain a conductive material such as tungsten nitride or tungsten, for example. The plugs 20, 21, 41, and 40 are formed to contain at least ruthenium silicide (RuSi), as described later in the first to fourth embodiments.

Semiconductor devices 1A, 1B, 1C, and 1D illustrated in FIGS. 4 to 17 are partial illustrations of the plugs 20, 21, 40, and 41 illustrated in FIGS. 1, 2, and 3 as well as the plug component portions corresponding to the wires 18, 19, 38, and 39 to which the plugs are connected. Hereinafter, FIGS. 4 to 17 will be referenced to describe the semiconductor devices 1A, 1B, 1C, and 1D according to the first to fourth embodiments, and a method of forming the same.

Figure 4:
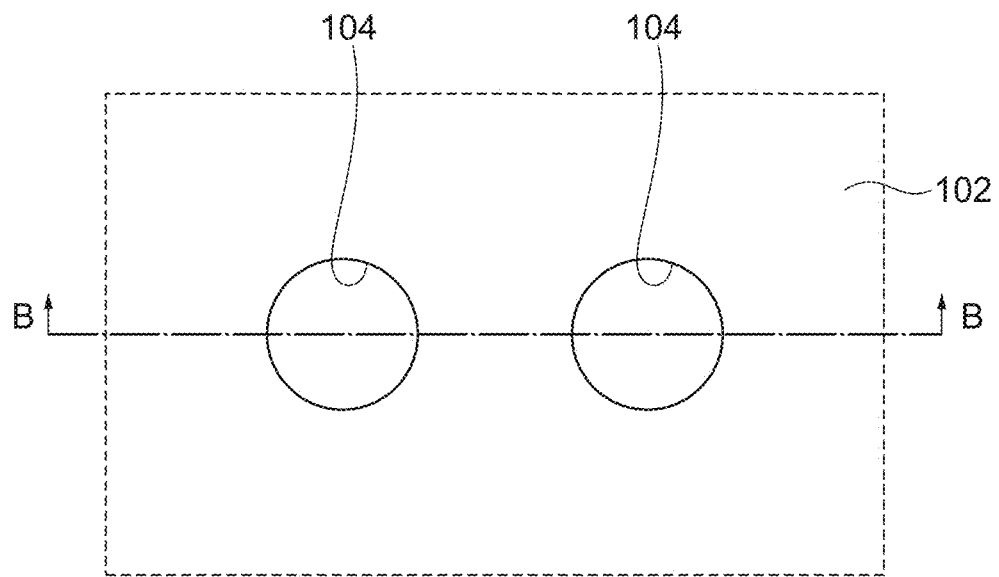
FIGS. 4 to 9 are diagrams illustrating a schematic configuration of the semiconductor device according to the first embodiment and a method of forming the same.
Figure 5:
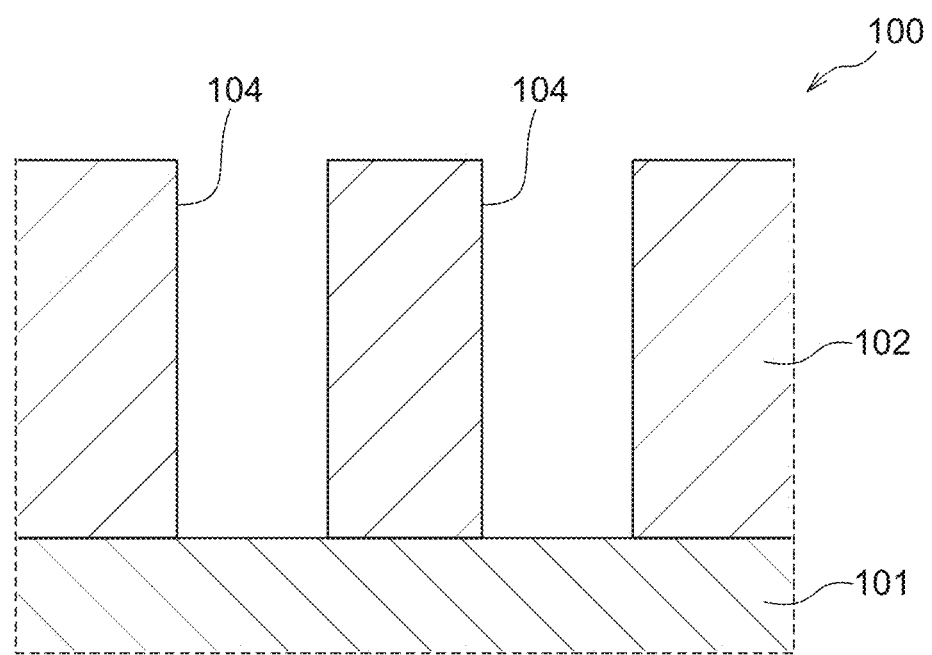

FIGS. 4 to 9 will be referenced to describe the semiconductor device 1B according to the first embodiment and a method of forming the same. A plan-view layout of the semiconductor device 1B is illustrated in FIG. 4. FIG. 5 is a longitudinal section of the portion along the line B-B in FIG. 4. The semiconductor device 1B is formed as follows.

First, a first conductive portion 100 will be described. First, as illustrated in FIGS. 4 and 5, a first insulating film 102 is formed on a first wiring layer 101, and contact holes 104 having a round shape in a plan view are formed in the first insulating film 102. The first conductive portion 100 includes an NMOS circuit, for example. The first wiring layer 101 corresponds to the wire 18 illustrated in diagrams such as FIG. 1. The first wiring layer 101 contains a conductive material such as tungsten nitride or tungsten, for example.

The tungsten nitride or tungsten is deposited by chemical vapor deposition (CVD), for example. Thereafter, lithography and dry etching are performed to pattern the tungsten nitride or tungsten, thereby forming the first wiring layer 101.

The insulating film 102 contains an insulating material such as silicon dioxide, for example. The first insulating film 102 is formed by CVD, for example. Thereafter, lithography and anisotropic dry etching are performed on the first wiring layer 101 to form the contact holes 104 that reach the surface of the first wiring layer 101. The contact holes 104 have a hollow round cylindrical shape that is open on top.

Figure 6:
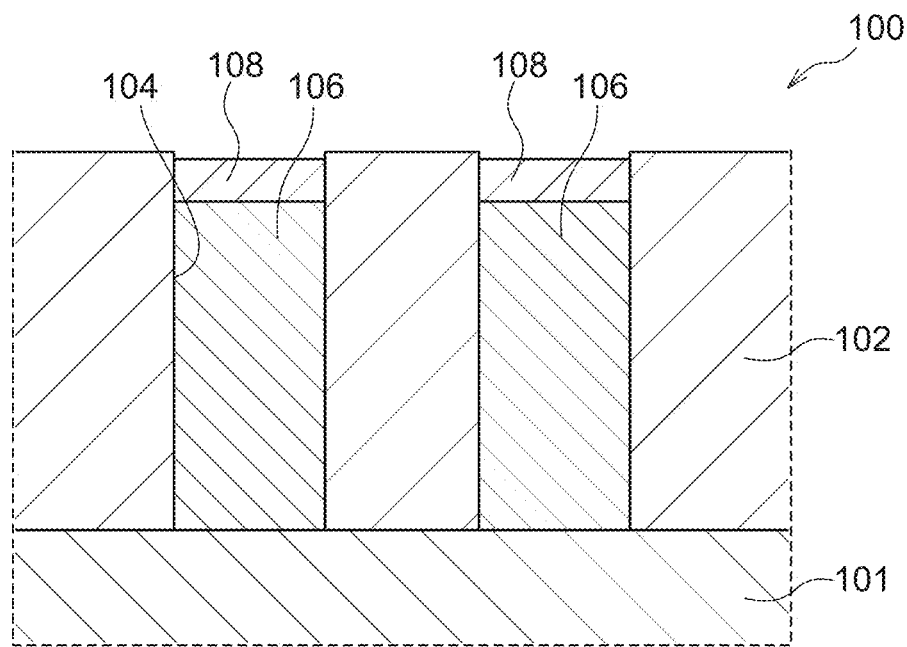

Next, as illustrated in FIG. 6, a first conductive material 106 and a second conductive material 108 are embedded in the contact holes 104. The first conductive material 106 is disposed in contact with the first wiring layer 101. The first conductive material 106 and the second conductive material 108 have a multilayer conductive structure stacked vertically inside the contact holes 104, in which the first conductive material 106 is disposed in a lower part and the second conductive material 108 is disposed to cover the top face of the first conductive material 106.

The first conductive material 106 contains a conductive material such as ruthenium, for example. The second conductive material 108 contains a conductive material such as silicon, for example. The ruthenium and silicon are deposited by CVD, for example. The first conductive material 106 and the second conductive material 108 are embedded inside the contact holes 104 as follows. First, the first conductive material 106 is deposited inside the contact holes 104 and on the first insulating film 102, and then etched back to form the first conductive material 106 in the lower part of the contact holes 104. The etchback is performed enough to remove the first conductive material 106 on the first insulating film 102 and form a slight depression in an upper part of the contact holes 104.

Next, the second conductive material 108 is deposited inside the contact holes 104 and on the first insulating film 102, and then etched back enough to expose the top face of the first insulating film 102. Through the above steps, the first conductive portion 100 is formed.

Figure 7:
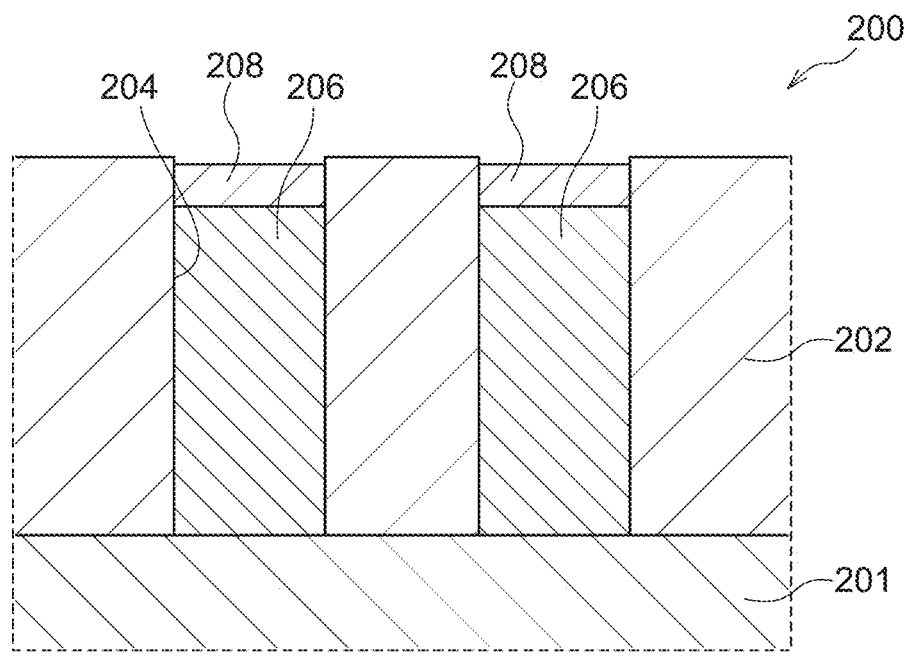

Also, as illustrated in FIG. 7, a second conductive portion 200 having a configuration similar to the first conductive portion 100 is formed according to steps similar to the above. The second conductive portion 200 includes a PMOS circuit, for example. The second conductive portion 200 is provided with a second wiring layer 201, a second insulating film 202, contact holes 204 provided in the second insulating film 202, and a third conductive material 206 as well as a fourth conductive material 208 embedded in the contact holes 204. These elements correspond to the first wiring layer 101, the first insulating film 102, the contact holes 104, the first conductive material 106, and the second conductive material 108 of the first conductive portion 100, and have a similar configuration.

Figure 8:
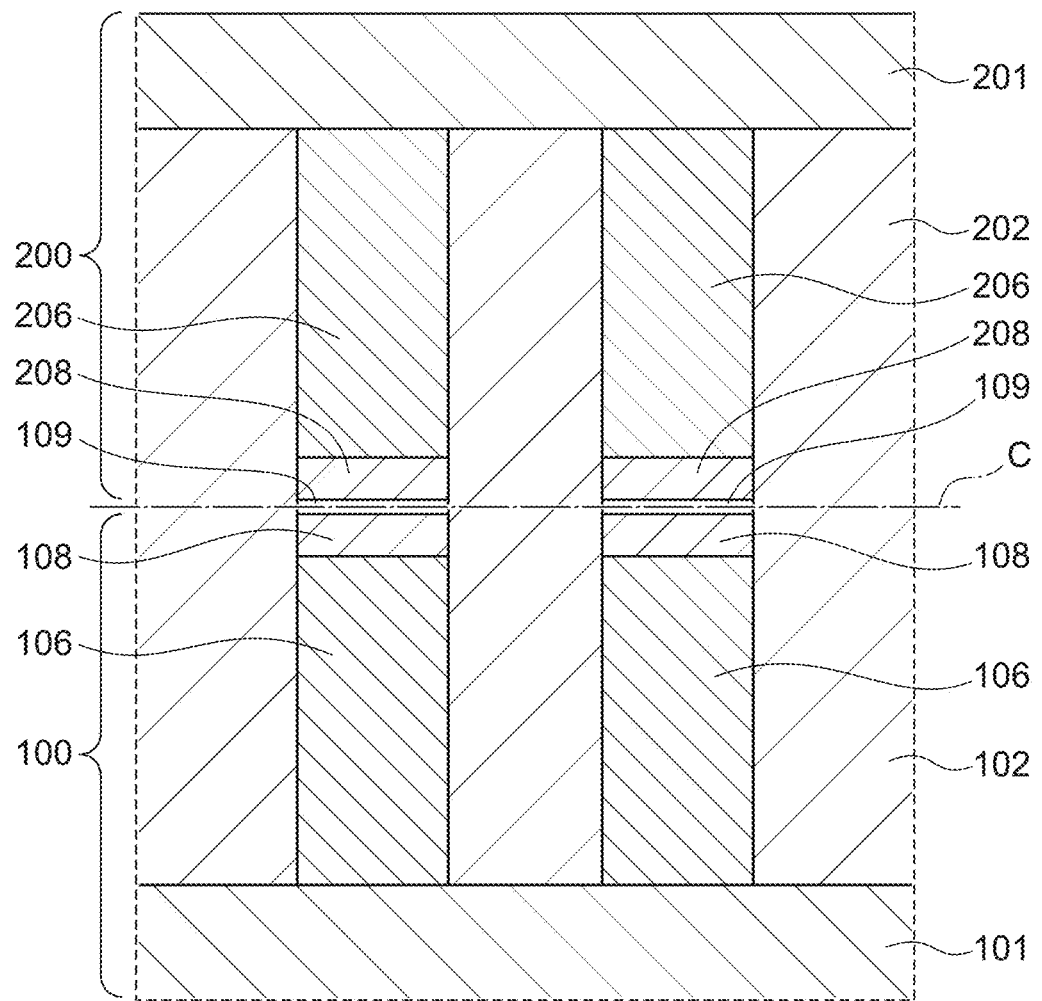

Next, as illustrated in FIG. 8, the first conductive portion 100 and the second conductive portion 200 are stacked. The second conductive portion 200 in FIG. 8 is illustrated in an upside-down state relative to the second conductive portion 200 illustrated in FIG. 7. The first conductive portion 100 and the second conductive portion 200 contact each other at a bonding surface C, and are bonded together by hybrid bonding. At the bonding surface C, the first insulating film 102 and the second insulating film 202 face opposite each other and come into contact. The second conductive material 108 and the fourth conductive material 208 face opposite each other but do not make contact, and a gap 109 is formed in between.

Figure 9:
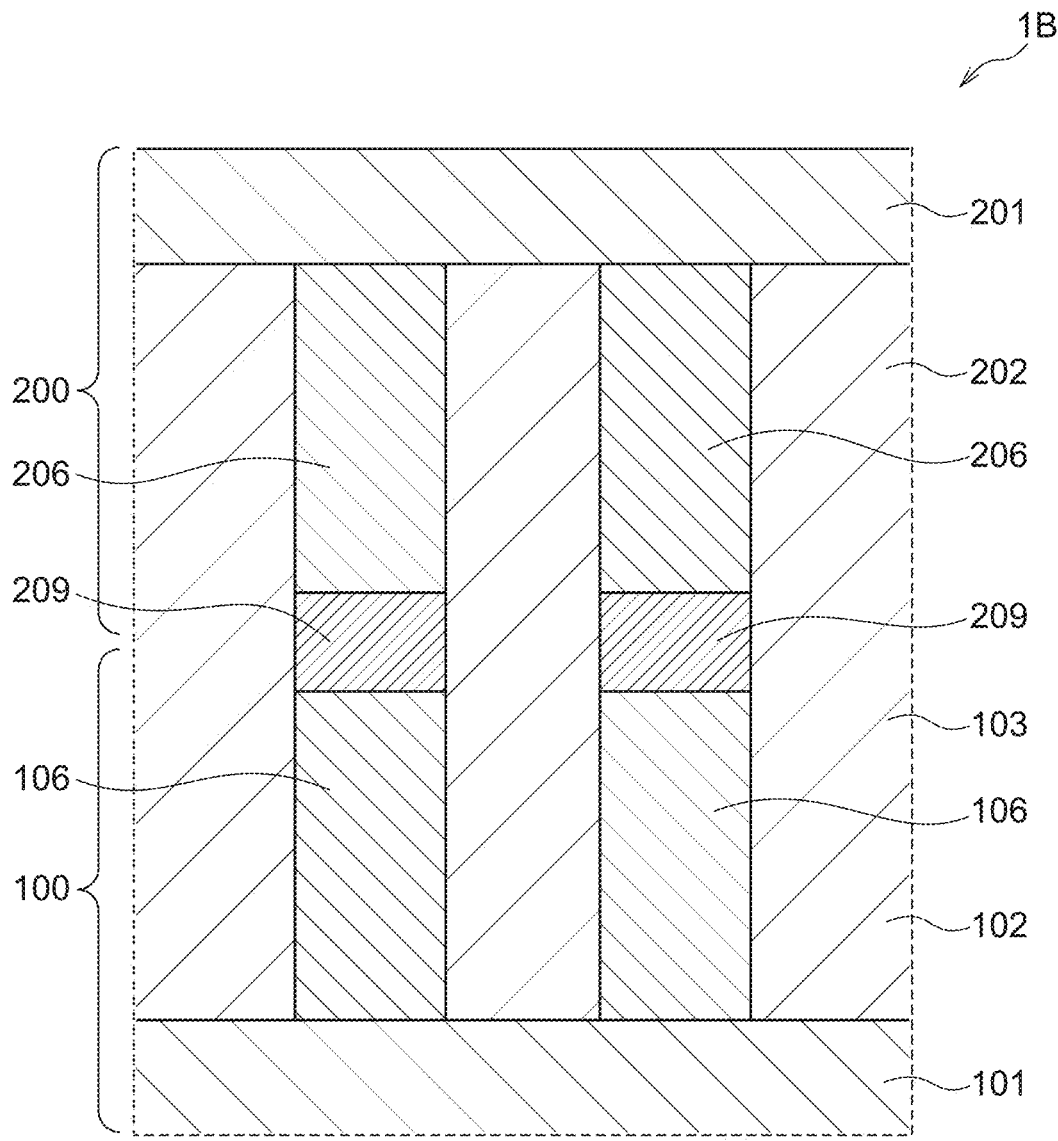

Next, silicidation is performed by annealing. By annealing, the second conductive material 108 and the first conductive material 106 as well as the fourth conductive material 208 and the third conductive material 206 react with each other to form ruthenium silicide, as illustrated in FIG. 9. The annealing is performed at a temperature of approximately 400 degrees Celsius or higher, for example. Through the annealing, the ruthenium and the silicon react, and the volume of the material expands when the ruthenium silicide is formed. For this reason, the ruthenium silicide produced by the reaction between the second conductive material 108 and the first conductive material 106 and also the ruthenium silicide produced by the reaction between the fourth conductive material 208 and the third conductive material 206 fill the gap 109 and bond together as one to form a fifth conductive material 209.

The first conductive material 106, the fifth conductive material 209, and the third conductive material 206 act as plug electrodes that connect the first wiring layer 101 and the second wiring layer 201. Through the above steps, the semiconductor device 1B according to the first embodiment is formed. The fifth conductive material 209 containing ruthenium silicide is interposed between the first conductive material 106 and the third conductive material 206. Ruthenium silicide is contained in at least a portion of the material between the first wiring layer 101 and the second wiring layer 201.

Next, FIG. 4, FIG. 5, and FIGS. 10 to 13 will be referenced to describe the semiconductor device 1C according to the second embodiment and a method of forming the same. The semiconductor device 1C is formed as follows. The method of depositing each film of the semiconductor device 1C is similar to the first embodiment. In the second embodiment, a first conductive portion 110 and a second conductive portion 210 are formed. First, for the first conductive portion 110, the steps described in FIGS. 4 and 5 are performed.

Figure 10:
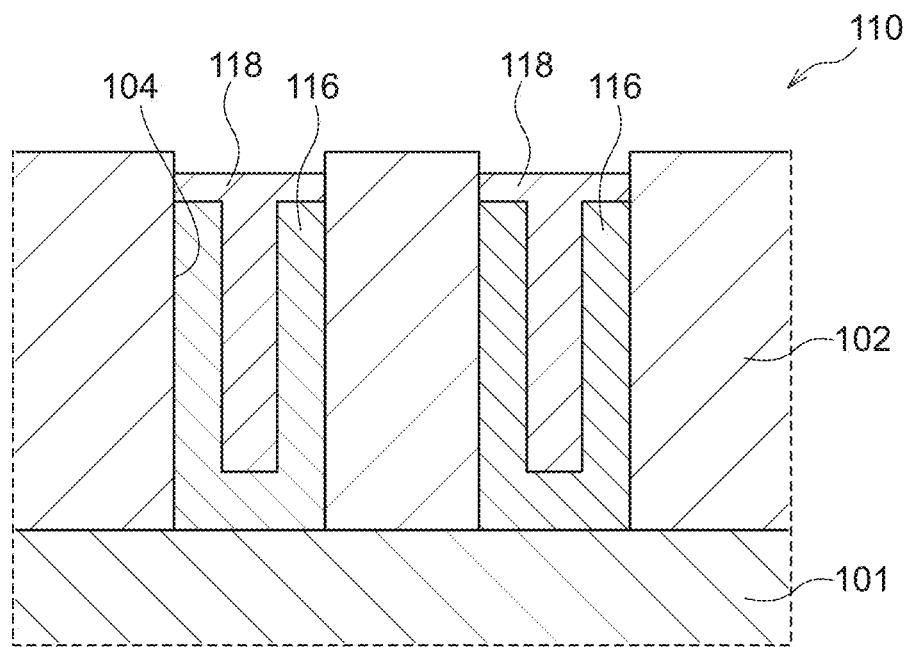
FIGS. 10 to 13 are diagrams illustrating a schematic configuration of the semiconductor device according to the second embodiment- and a method of forming the same.

Next, as illustrated in FIG. 10, a first conductive material 116 is formed along the inner walls of the contact holes 104. The first conductive material 116 contains ruthenium. The ruthenium is deposited by CVD for example, with a thickness that is not enough to fill the contact holes 104. At this time, the ruthenium is deposited on the inner walls of the contact holes 104 as well as on the top face of the first insulating film 102.

Next, the ruthenium is etched back to expose at least the surface of the first insulating film 102. With this arrangement, the first conductive material 116 containing ruthenium is formed only on the inner walls of the contact holes 104. The upper ends of the first conductive material 116 are positioned slightly below the top face of the first insulating film 102, and the first conductive material 116 is not formed on the uppermost part of the inner walls of the contact holes 104. With this arrangement, the side faces and floor of the contact holes 104 are covered by the first conductive material 116, and the first conductive material 116 is formed in a cup shape.

Next, a second conductive material 118 is formed inside the contact holes 104. The second conductive material 118 contains silicon. The silicon is embedded inside the contact holes 104 covering the inner side faces and top face of the cup-shaped first conductive material 116, and is also formed on the top face of the first insulating film 102. Next, the silicon is etched back enough to expose at least the surface of the first insulating film 102. The etchback is adjusted to end before the top face of the first conductive material 116 is exposed. With this arrangement, the cup-shaped first conductive material 116 as well as the second conductive material 118 covering the side faces and the top face of the first conductive material 116 are formed inside the contact holes 104.

In the longitudinal section illustrated in FIG. 10, the first conductive material 116 is U-shaped, while the second conductive material 118 is T-shaped. In the contact holes 104, the first conductive material 116 and the second conductive material 118 have a combined structure obtained by nesting the T-shape into the U-shape. In the contact holes 104, the first conductive material 116 and the second conductive material 118 contact each other on their side faces extending vertically throughout the contact holes 104, and the contact area is large. The second conductive material 118 and the first conductive material 116 as well as a fourth conductive material 218 and a third conductive material 216 are set to be roughly equal to each other by volume ratio, for example.

Figure 11:
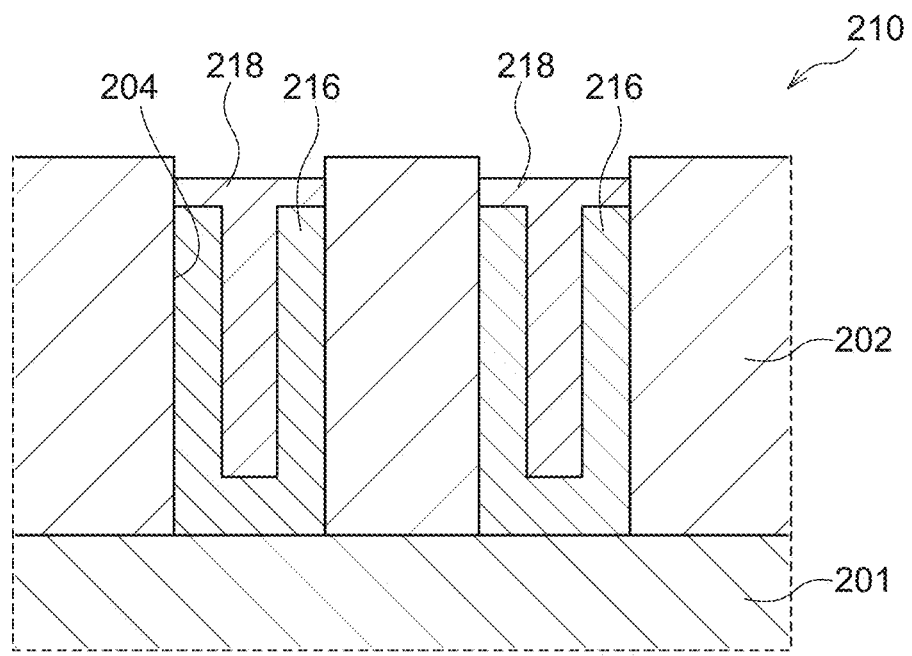

Also, as illustrated in FIG. 11, a second conductive portion 210 having a configuration similar to the first conductive portion 110 is formed according to steps similar to the above. The second conductive portion 210 includes a PMOS circuit, for example. The second conductive portion 210 is provided with a second wiring layer 201, a second insulating film 202, contact holes 204 provided in the second insulating film 202, and a third conductive material 216 as well as a fourth conductive material 218 embedded in the contact holes 204. These elements correspond to the first wiring layer 101, the first insulating film 102, the contact holes 104, the first conductive material 116, and the second conductive material 118 of the first conductive portion 110, and have a similar configuration.

Figure 12:
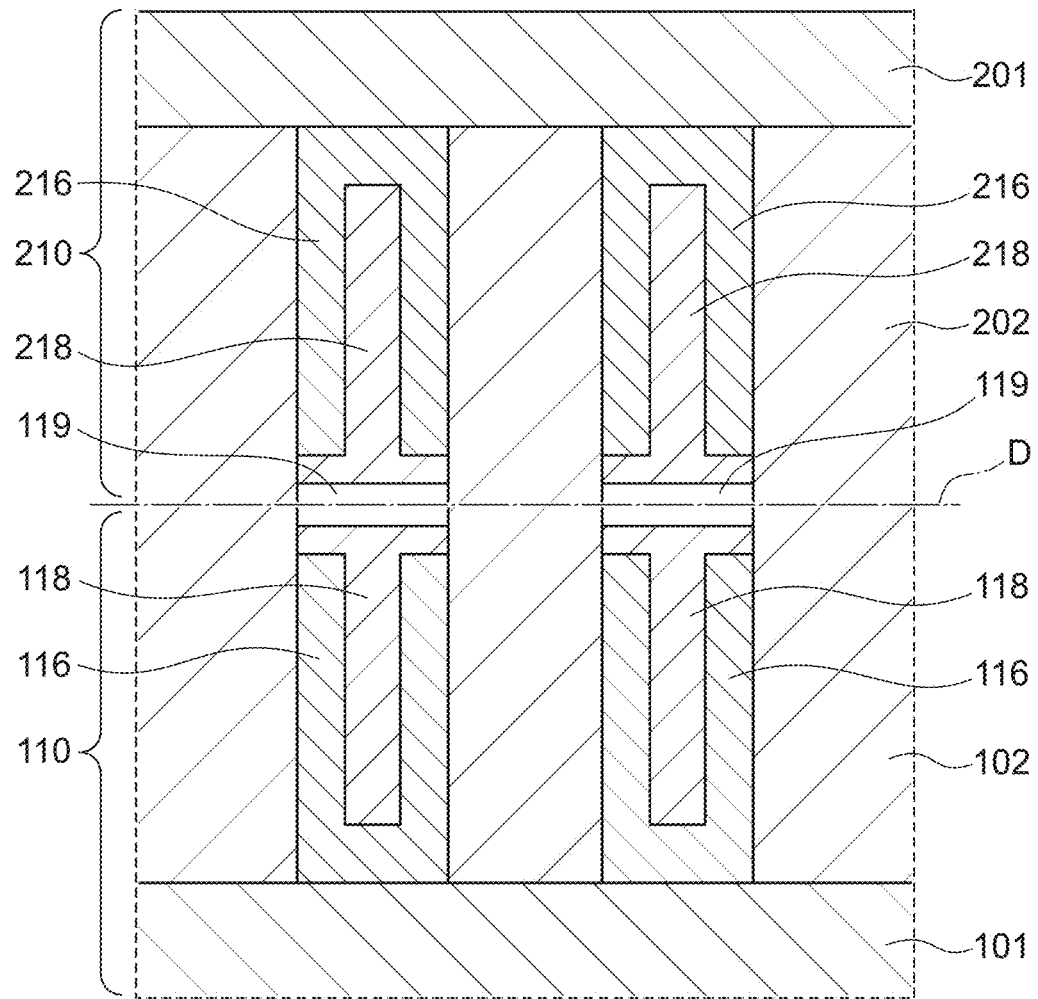

Next, as illustrated in FIG. 12, the first conductive portion 110 and the second conductive portion 210 are stacked. The second conductive portion 210 in FIG. 12 is illustrated in an upside-down state relative to the second conductive portion 210 illustrated in FIG. 11. The first conductive portion 110 and the second conductive portion 210 contact each other at a bonding surface D, and are bonded together by hybrid bonding. At the bonding surface D, the first insulating film 102 and the second insulating film 202 face opposite each other and come into contact. The second conductive material 118 and the fourth conductive material 218 face opposite each other but do not make contact, and a gap 119 is formed in between.

Figure 13:
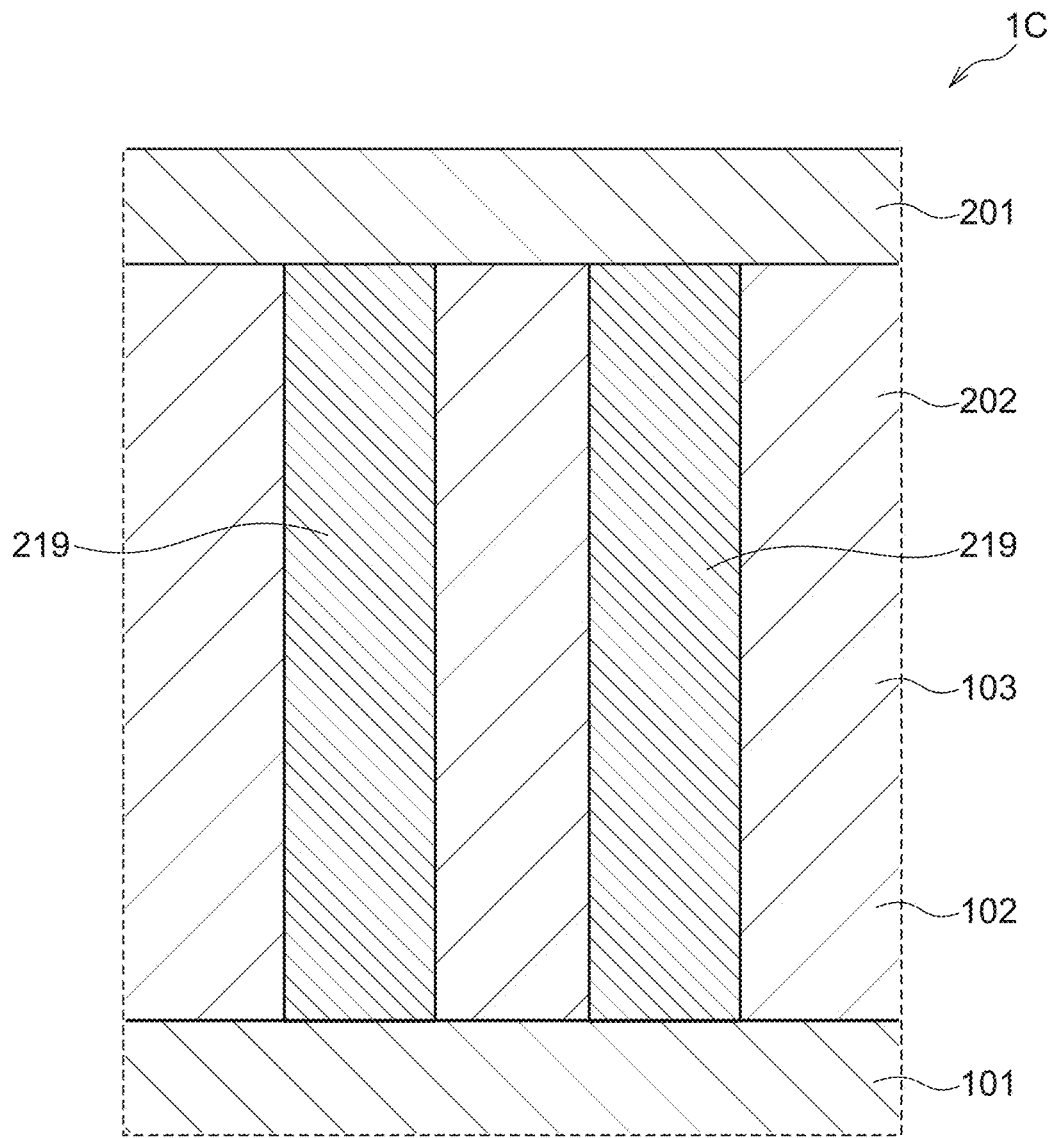

Next, by annealing, the second conductive material 118 and the first conductive material 116 as well as the fourth conductive material 218 and the third conductive material 216 in the contact holes 104 react with each other completely to form ruthenium silicide, as illustrated in FIG. 13. The ruthenium and the silicon react, and the volume of the material expands when the ruthenium silicide is formed. In the contact holes 104, the first conductive material 116 and the second conductive material 118 are formed to contact each other on their side faces extending vertically throughout the contact holes 104. With this arrangement, when silicidation is performed, all of the ruthenium and silicon in the contact holes 104 react.

For this reason, the ruthenium silicide produced by the reaction between the second conductive material 118 and the first conductive material 116 and also the ruthenium silicide produced by the reaction between the fourth conductive material 218 and the third conductive material 216 fill the gap 119 and unite to form a fifth conductive material 219. With this arrangement, the contact holes 104 are filled by the fifth conductive material 219 containing ruthenium silicide. In this way, the fifth conductive material 219 has a cylindrical shape and acts as a plug electrode that connects the first wiring layer 101 and the second wiring layer 201.

Through the above steps, the semiconductor device 1C according to the second embodiment is formed. The fifth conductive material 219 containing ruthenium silicide is interposed between the first wiring layer 101 and the second wiring layer 201, and connects the first wiring layer 101 and the second wiring layer 201.

Next, FIG. 4, FIG. 5, and FIGS. 14 to 17 will be referenced to describe the semiconductor device 1D according to the third embodiment and a method of forming the same. The semiconductor device 1D is formed as follows. The method of depositing each film of the semiconductor device 1D is similar to the first embodiment. In the third embodiment, a first conductive portion 120 and a second conductive portion 220 are formed. First, for the first conductive portion 120, the steps described in FIGS. 4 and 5 are performed.

Figure 14:
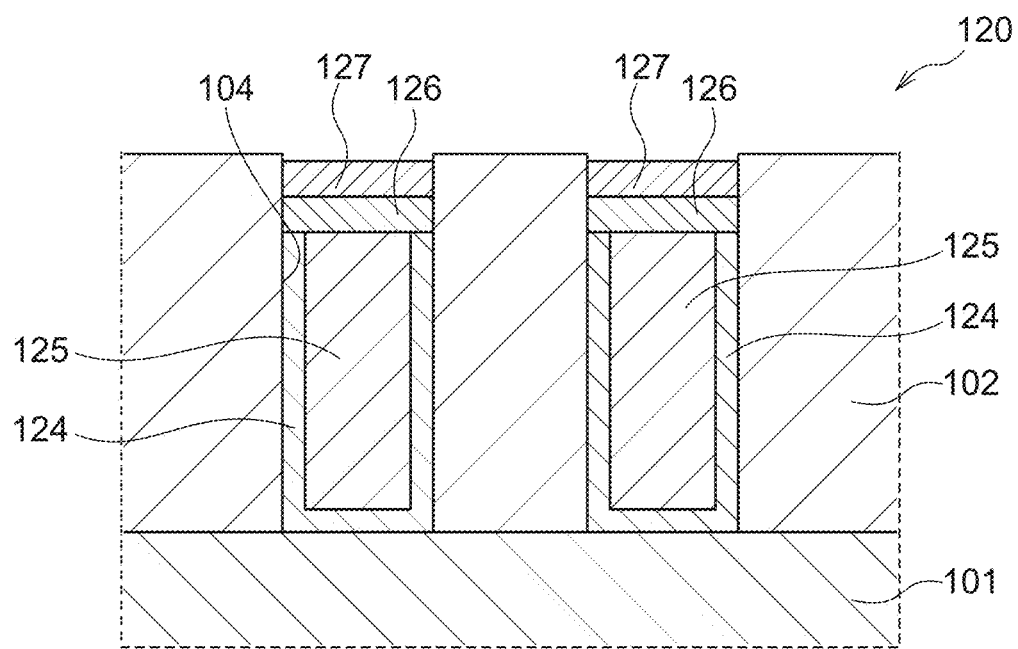
FIGS. 14 to 17 are diagrams illustrating a schematic configuration of the semiconductor device according to the third embodiment and a method of forming the same.

Next, as illustrated in FIG. 14, a barrier metal 124 and a first conductive material 125 are formed in the contact holes 104. The barrier metal 124 contains titanium nitride. The first conductive material 125 contains tungsten. The barrier metal 124 is formed in a cup shape along the inner walls of the contact holes 104. The first conductive material 125 is formed to fill the inside of the cup-shaped barrier metal 124.

The top faces of the barrier metal 124 and the first conductive material 125 are recessed downward from the top face of the first insulating film 102. The barrier metal 124 is formed by being deposited along the inner walls of the contact holes 104 by CVD and then being etched back. The first conductive material 125 is formed by being deposited by CVD and then being etched back.

A second conductive material 126 and a third conductive material 127 are stacked and formed on top of the barrier metal 124 and the first conductive material 125. The second conductive material 126 contains ruthenium. The third conductive material 127 contains silicon. The second conductive material 126 is formed by depositing ruthenium by CVD and then etching back the ruthenium. The third conductive material 127 is formed by forming silicon by CVD and then etching back the silicon.

Figure 15:
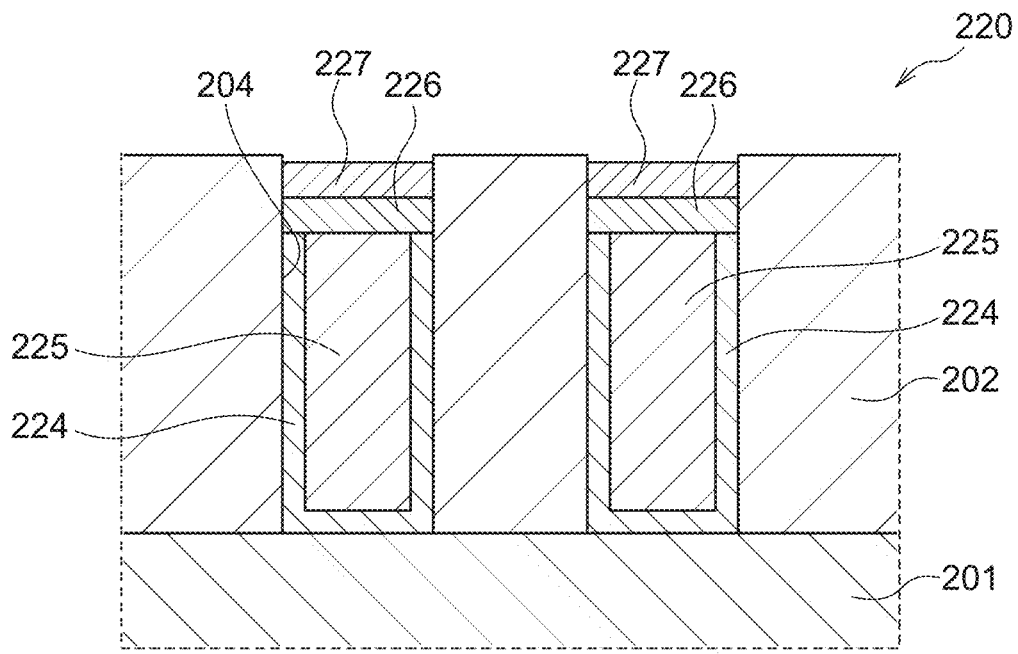

Also, as illustrated in FIG. 15, a second conductive portion 220 is formed according to steps similar to the above. The second conductive portion 220 includes a PMOS circuit, for example. The second conductive portion 220 is provided with a second wiring layer 201, a second insulating film 202, contact holes 204 provided in the second insulating film 202, and a barrier metal 224, a fifth conductive material 225, a sixth conductive material 226, and a seventh conductive material 227 embedded in the contact holes 204. These elements have a configuration similar to the first wiring layer 101, the first insulating film 102, the barrier metal 124, the first conductive material 125, the second conductive material 126, and the third conductive material 127 of the first conductive portion 120.

Figure 16:
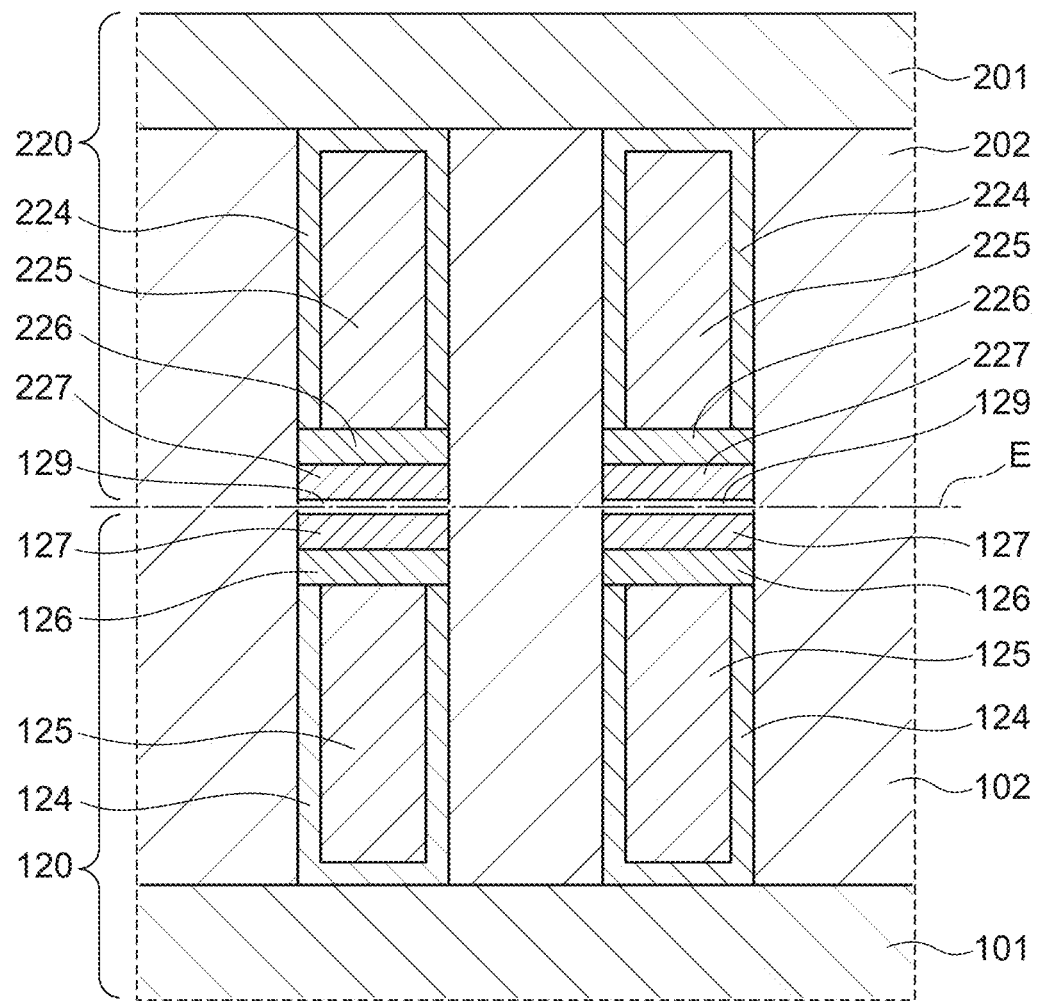

Next, as illustrated in FIG. 16, the first conductive portion 120 and the second conductive portion 220 are stacked. The second conductive portion 220 in FIG. 16 is illustrated in an upside-down state relative to the second conductive portion 220 illustrated in FIG. 15. The first conductive portion 120 and the second conductive portion 220 contact each other at a bonding surface E, and are bonded together by hybrid bonding. At the bonding surface E, the first insulating film 102 and the second insulating film 202 face opposite each other and come into contact. The third conductive material 127 and the seventh conductive material 227 face opposite each other but do not make contact, and a gap 129 is formed in between.

Figure 17:
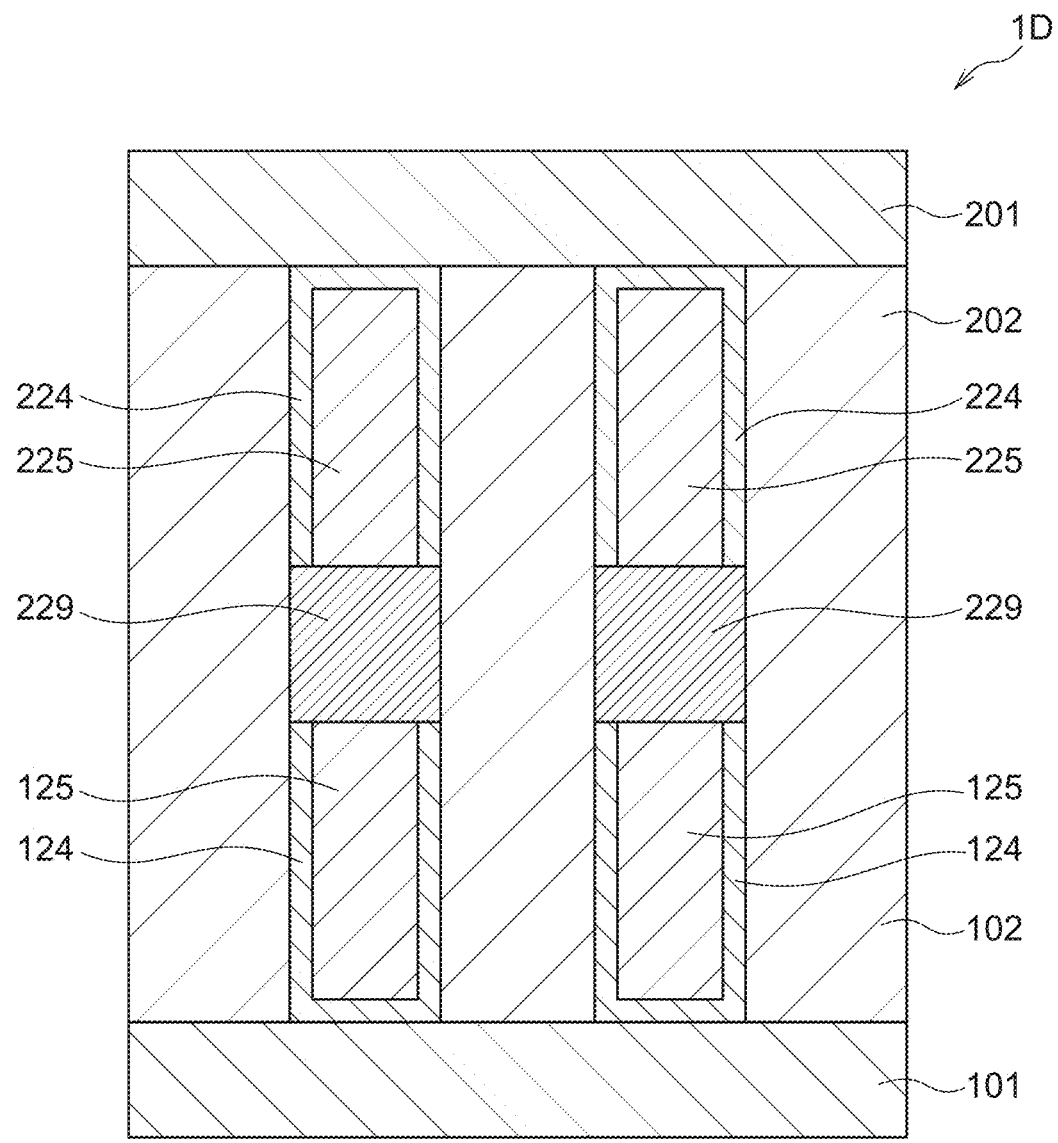

Next, silicidation is performed by annealing. By annealing, the second conductive material 126 and the third conductive material 127 as well as the sixth conductive material 226 and the seventh conductive material 227 in the contact holes 104 react with each other to form ruthenium silicide, as illustrated in FIG. 17.

The annealing is performed at a temperature of approximately 400 degrees Celsius or higher, for example. Through the annealing, the ruthenium and the silicon react, and the volume of the material expands when the ruthenium silicide is formed. For this reason, the ruthenium silicide produced by the reaction between the second conductive material 126 and the third conductive material 127 and also the ruthenium silicide produced by the reaction between the sixth conductive material 226 and the seventh conductive material 227 fill the gap 129 and bond to form an eighth conductive material 229.

The barrier metal 124, the first conductive material 125, the barrier metal 224, the fifth conductive material 225, and the eighth conductive material 229 act as plug electrodes that connect the first wiring layer 101 and the second wiring layer 201. Through the above steps, the semiconductor device 1D according to the third embodiment is formed. The eighth conductive material 229 containing ruthenium silicide is interposed between the first wiring layer 101 and the second wiring layer 201, and connects the first wiring layer 101 and the second wiring layer 201.

Fourth to Sixth Embodiments

Figure 18:
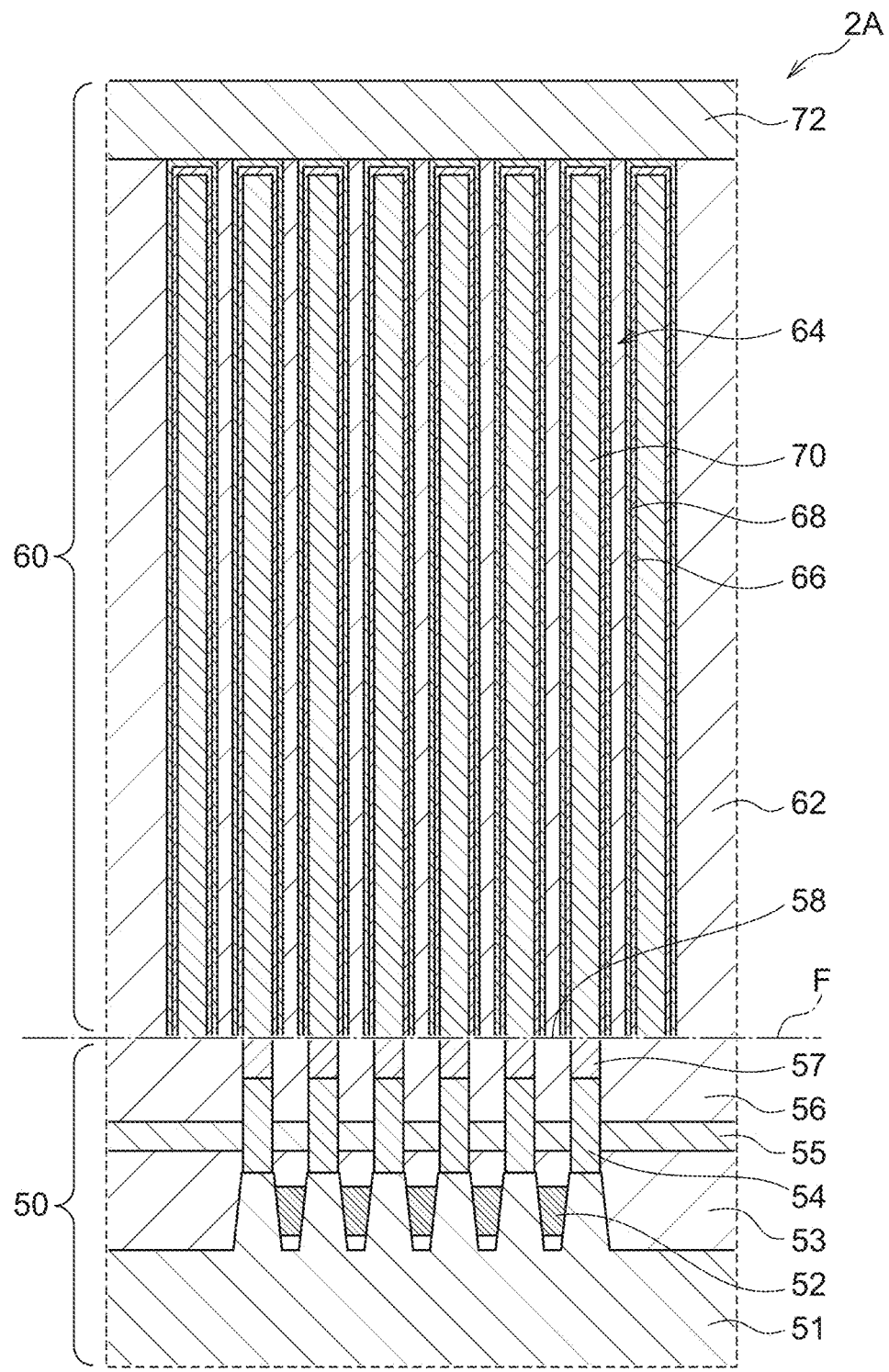
FIG. 18 is a diagram for explaining a semiconductor device according to fourth, fifth, and sixth embodiments, and is a longitudinal section illustrating an example of a schematic configuration of DRAM having a hybrid bonding structure.

Next, a semiconductor device 2A to which the fourth to the sixth embodiments are applied will be described with reference to FIG. 18. Hereinafter, dynamic random access memory (DRAM) will be described as an example of the semiconductor device 2A. FIG. 18 is a longitudinal section illustrating an example of a schematic configuration of the semiconductor device 2A.

As illustrated in FIG. 18, the semiconductor device 2A is provided with a transistor portion 50 and a capacitor portion 60. The transistor portion 50 is provided with a semiconductor substrate 51, gate electrodes 52, an isolation 53, capacitive contacts 54, a bit line 55, an insulating film 56, and plugs 57. The semiconductor substrate 51 contains single-crystal silicon, for example. The gate electrodes 52 function as DRAM word lines, and the gate electrodes 52 together with a source and drain disposed on either side form the access transistor of a DRAM memory cell. As illustrated in FIG. 18, the gate electrodes 52 are exemplified as the gate electrodes of embedded gate transistors.

The capacitor portion 60 is provided with an insulating film 62, capacitors 64, and a plate electrode 72. The capacitors 64 are formed inside holes provided in the insulating film 62, and each is provided with a capacitive insulating film 66, an upper electrode 68, and a lower electrode 70. The upper electrode 68 and the capacitive insulating film 66 are stacked and have an inverted cup shape overall, while the lower electrode 70 is provided to fill the inside of the cup shape. The lower ends of the lower electrodes 70 contact the plugs 57 at a contacting portion 58. The upper electrodes 68 contact the plate electrode 72.

The semiconductor device 2A is formed by preparing the transistor portion 50 and the capacitor portion 60 formed separately, rotating either the transistor portion 50 or the capacitor portion 60 upside-down, and bringing the faces of the transistor portion 50 and the capacitor portion 60 in contact to connect to each other through hybrid bonding. The fourth to sixth embodiments described hereinafter relate to connecting the plugs 57 of the transistor portion 50 to the capacitors 64 of the capacitor portion 60.

The fourth to sixth embodiments described hereinafter are described with particular focus on the connection between the plugs 57 and the capacitors 64, and are described using diagrams that illustrate the portions corresponding to the connecting portion between the plugs 57 and the capacitors 64 of the transistor portion 50 and the capacitor portion 60. In the following description, plugs 167 corresponds to the plugs 57, while capacitors 234, 244, and 254 correspond to the capacitors 64.

Figure 19:
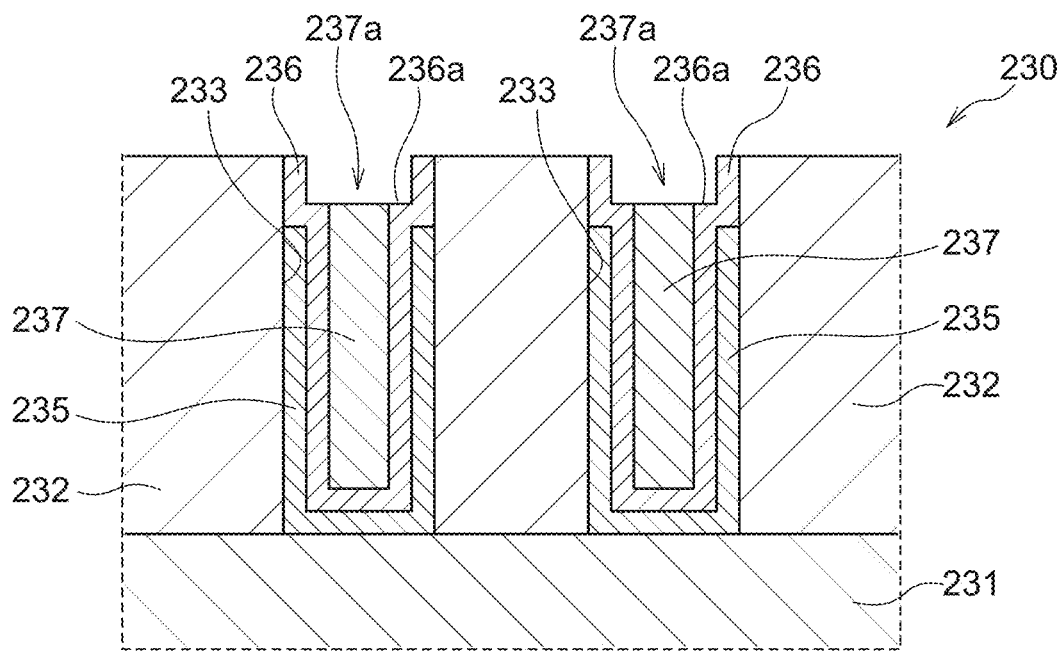
FIGS. 19 to 22 are diagrams illustrating a schematic configuration of the semiconductor device according to the fourth embodiment and a method of forming the same.

FIGS. 19 to 22 will be referenced to describe a semiconductor device 2B according to the fourth embodiment and a method of forming the same. The semiconductor device 2B is formed as follows. First, a capacitor portion 230 will be described. As illustrated in FIG. 19, an insulating film 232 is formed on a plate electrode 231, and holes 233 are formed in the insulating film 232. The plate electrode 231 corresponds to the plate electrode 72 illustrated in FIG. 18. Note that the holes 233 have a round shape in a plan view.

The plate electrode 231 contains a conductive material such as tungsten nitride or tungsten, for example. The tungsten nitride or tungsten is deposited by CVD, for example. Lithography and dry etching are performed to pattern the tungsten nitride or tungsten, thereby forming the plate electrode 231.

The insulating film 232 contains an insulating material such as silicon dioxide, for example. The holes 233 are formed by performing lithography and anisotropic dry etching on the insulating film 232. The holes 233 penetrate from the top face of the insulating film 232 to the top face of the plate electrode 231.

An upper electrode 235 is formed in a cup shape along the inner walls of the holes 233. Also, as illustrated in FIG. 19, the upper electrode 235 has a U-shaped cross section. The upper electrode 235 contains a conductive film such as titanium nitride, for example. The upper electrode 235 is formed by being deposited using CVD for example, and then being etched back. At this time, the etchback is performed such that the upper end of the upper electrode 235 is recessed downward from the top face of the insulating film 232.

Next, a capacitive insulating film 236 is formed inside the holes 233, following the shape of the upper electrode 235 formed on the inner walls of the holes 233. At this time, the thicknesses of the upper electrode 235 and the capacitive insulating film 236 are set such that the interior space in the holes 233 is not completely filled by the upper electrode 235 and the capacitive insulating film 236. The capacitive insulating film 236 contains a high-k insulating material having a high relative permittivity, and contains a metallic oxide material such as $HfO_2$, $ZrO_2$, or $Al_2O_3$ for example.

The capacitive insulating film 236 is formed by being deposited using CVD for example, and then being etched back. The capacitive insulating film 236 is provided with a shoulder 236a formed along the upper end portion of the upper electrode 235. With this arrangement, the capacitive insulating film 236 has a cup shape whose upper portion is slightly widened by the shoulder 236a. The upper end of the capacitive insulating film 236 is substantially aligned with the top face of the insulating film 232.

Next, a first lower electrode 237 is embedded in the central part of the holes 233. The first lower electrode 237 contains silicon (Si). The plug-shaped first lower electrode 237 is formed by depositing silicon by CVD, and then etching back the silicon until the top face of the silicon is roughly aligned with the shoulder 236a. A recessed portion 237a depressed from the top face of the insulating film 232 is formed above the first lower electrode 237.

Figure 20:
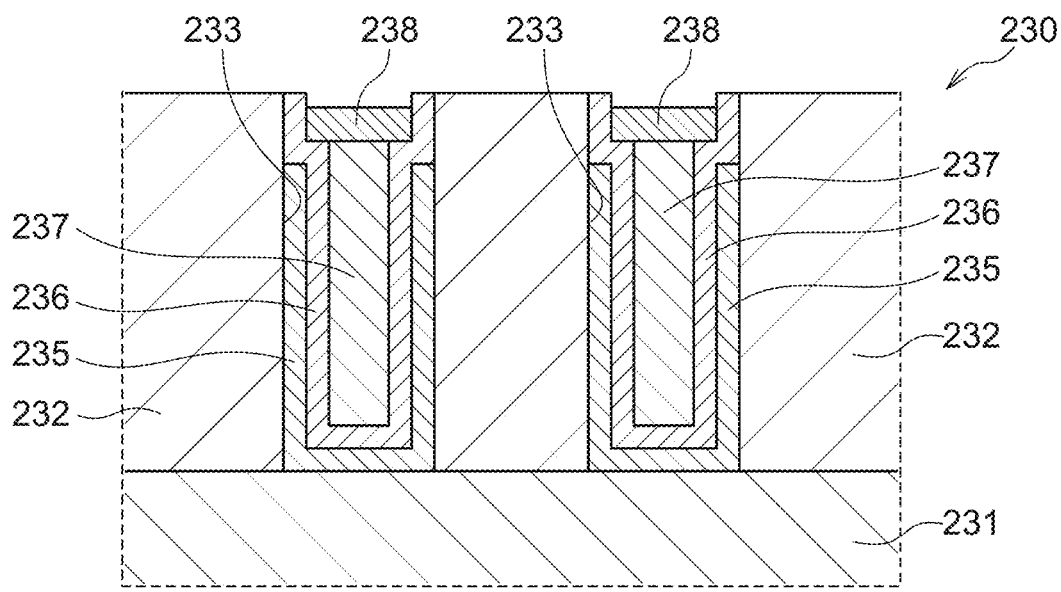

Next, as illustrated in FIG. 20, a metal portion 238 is formed in the recessed portion 237a. The metal portion 238 is metal, and contains ruthenium. The metal portion 238 is formed by depositing ruthenium by CVD to fill the recessed portion 237a, and then etching back the ruthenium. The metal portion 238 and the first lower electrode 237 contact each other. Through the above steps, the capacitor portion 230 is formed.

Figure 21:
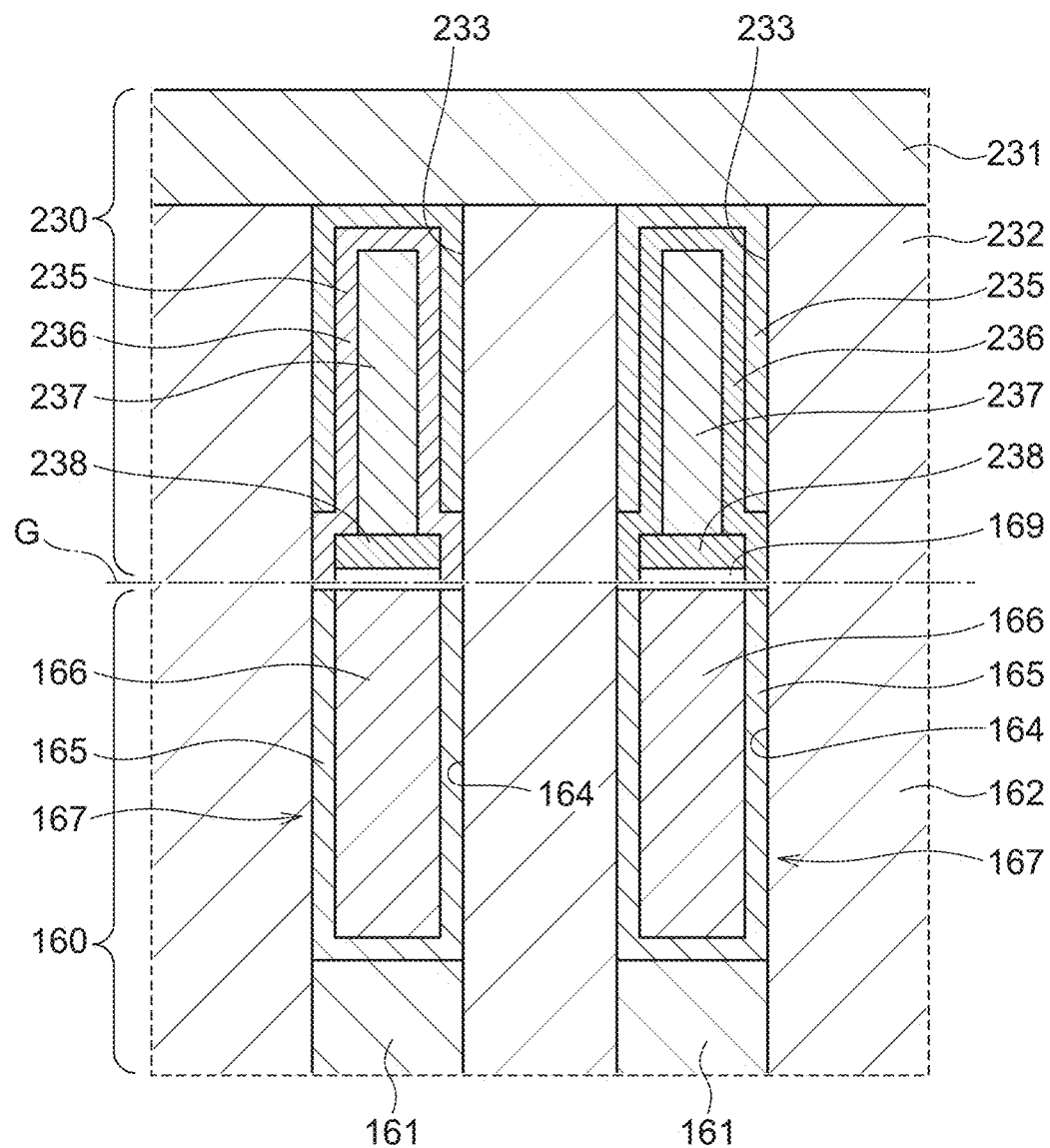

Next, as illustrated in FIG. 21, the capacitor portion 230 is stacked onto a plug portion 160. The plug portion 160 and the capacitor portion 230 are bonded together by hybrid bonding. The capacitor portion 230 in FIG. 21 is illustrated in an upside-down state relative to the capacitor portion 230 illustrated in FIG. 20. In the plug portion 160, capacitive contacts 161 correspond to the capacitive contacts 54 in FIG. 18, and plugs 167 correspond to the plugs 57 in FIG. 18.

The plug portion 160 is formed by performing lithography and anisotropic dry etching on an insulating film 162, forming contact holes 164 that reach the capacitive contacts 161, and then filling the contact holes 164 with a barrier metal 165 and a metal 166. The capacitive contacts 161 contain tungsten, for example. The insulating film 162 contains silicon dioxide, for example. The barrier metal 165 contains titanium nitride for example, and the metal 166 contains tungsten for example.

The plug portion 160 and the capacitor portion 230 contact each other at a bonding surface G, and are bonded together by hybrid bonding. At the bonding surface G, the insulating film 162 and the insulating film 232 face opposite each other and come into contact. The metal portion 238 and the metal 166 face opposite each other but do not make contact, and a gap 169 is formed in between.

Figure 22:
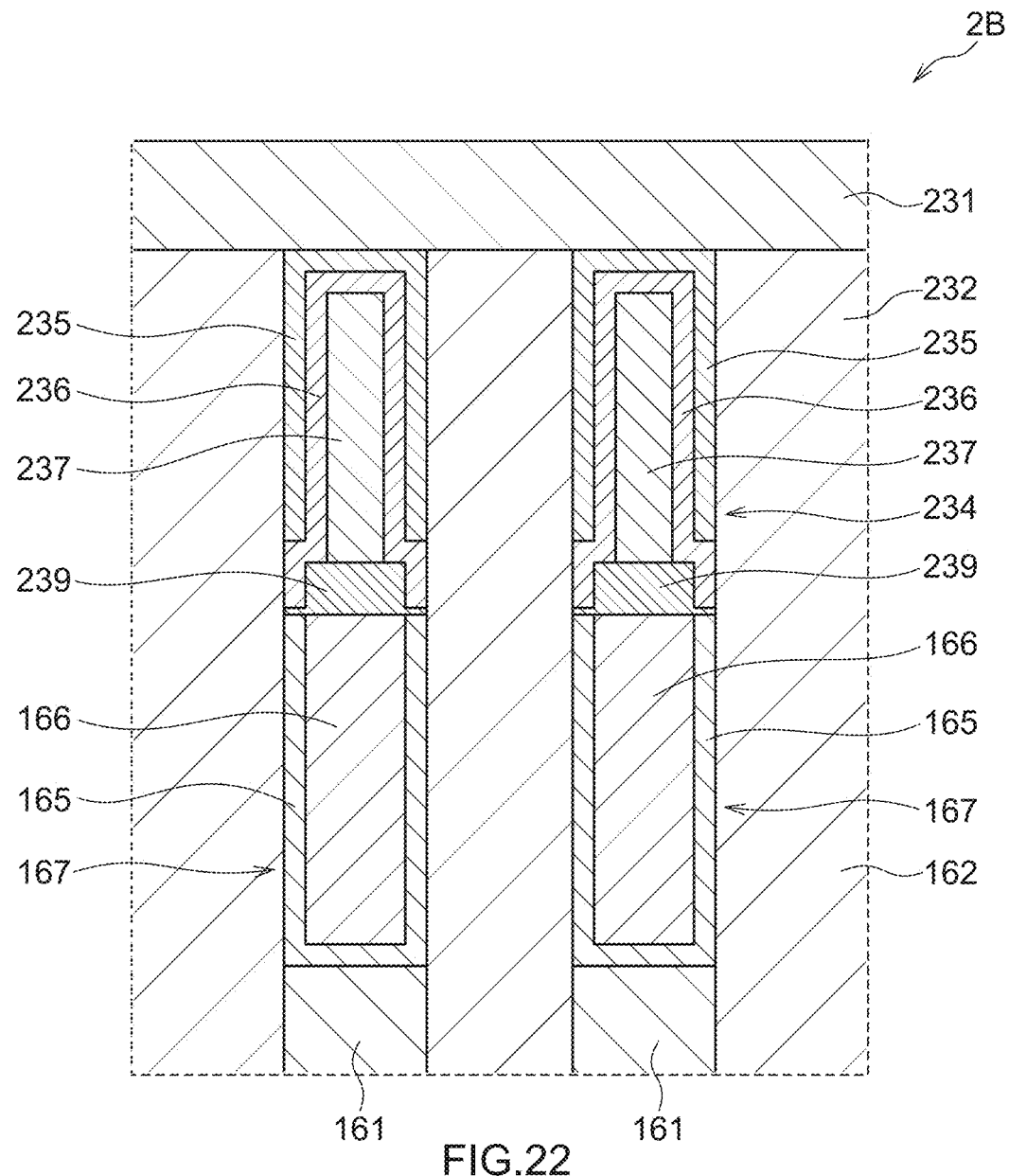

Next, by annealing, the first lower electrode 237 of the capacitors 234 and the metal portion 238 react to form a metal silicide portion 239 that contains ruthenium silicide, as illustrated in FIG. 22. The ruthenium and the silicon react, and the volume of the material expands when the ruthenium silicide is formed. For this reason, the generated ruthenium silicide fills the gap 169 to contact the plugs 167, thereby causing the first lower electrode 237 of the capacitors 234 and the plugs 167 to contact each other with the metal silicide portion 239 in between, and forming an electrical connection.

Through the above steps, the semiconductor device 2B according to the fourth embodiment is formed. The metal silicide portion 239 containing ruthenium silicide is interposed between the plate electrode 231 and the capacitive contacts 161, and connects the plate electrode 231 and the capacitive contacts 161. Ruthenium silicide is contained in at least a portion of the material between the plate electrode 231 and the capacitive contacts 161.

Figure 23:
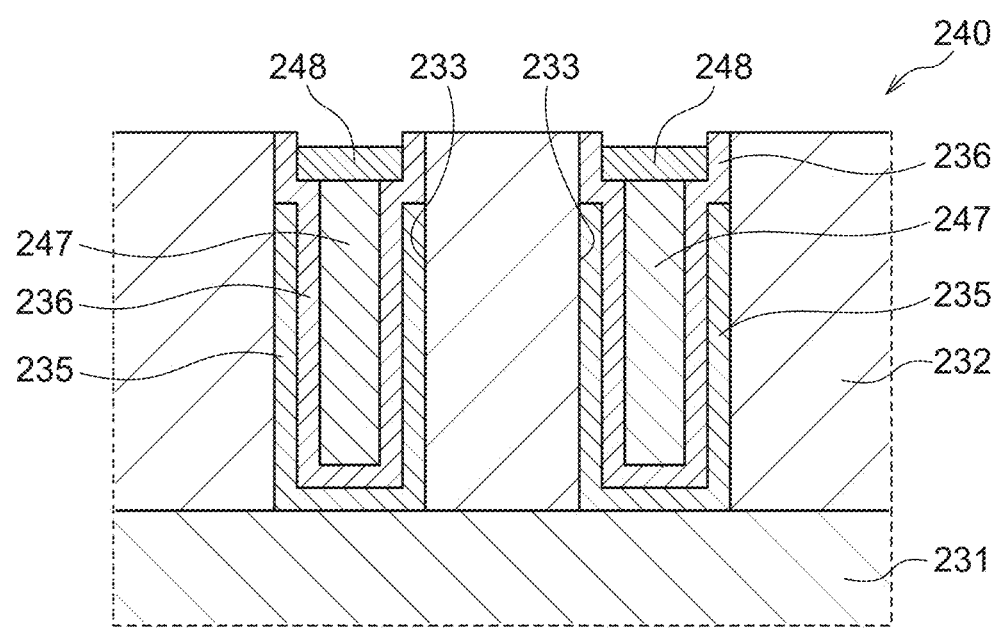
FIGS. 23 to 25 are diagrams illustrating a schematic configuration of the semiconductor device according to the fifth embodiment and a method of forming the same.
Figure 24:
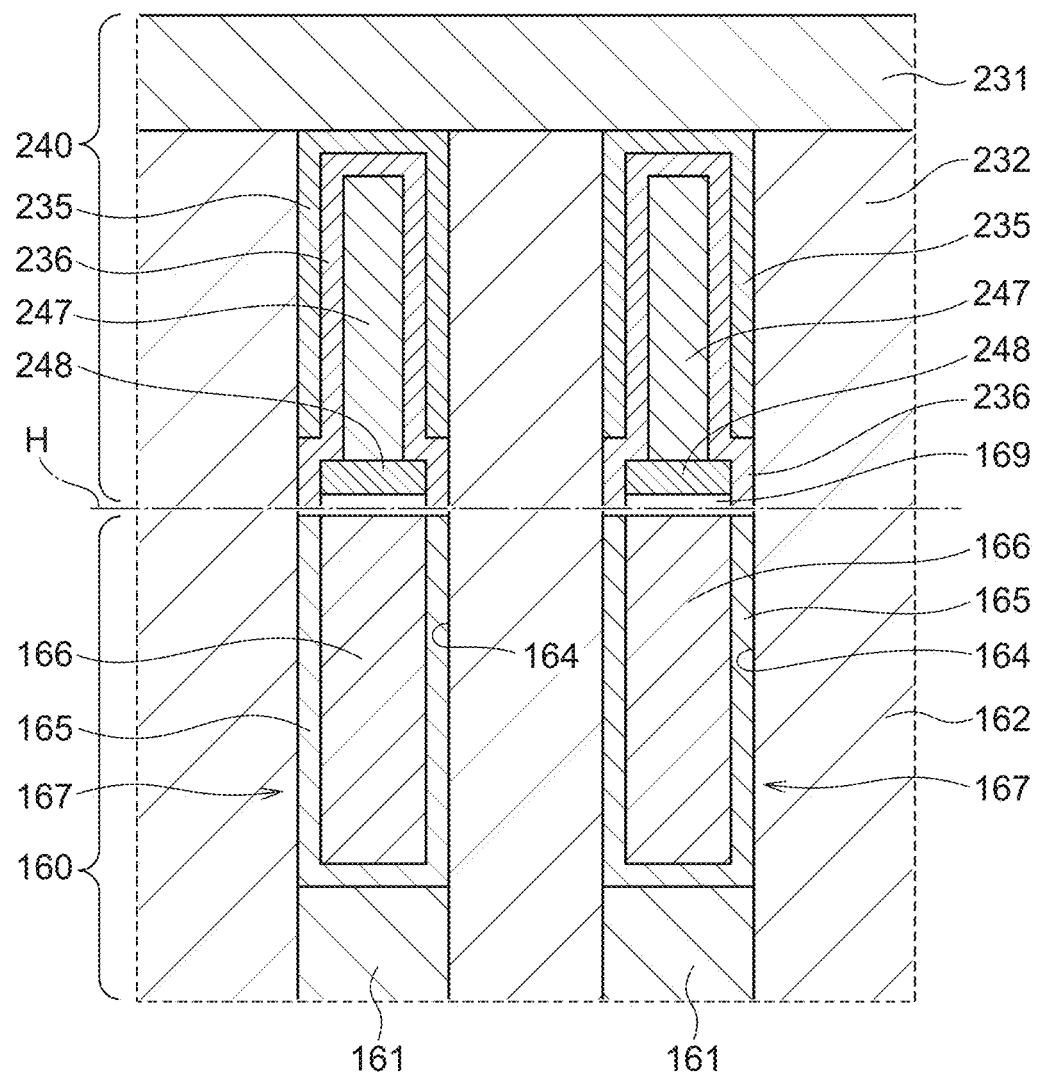
Figure 25:
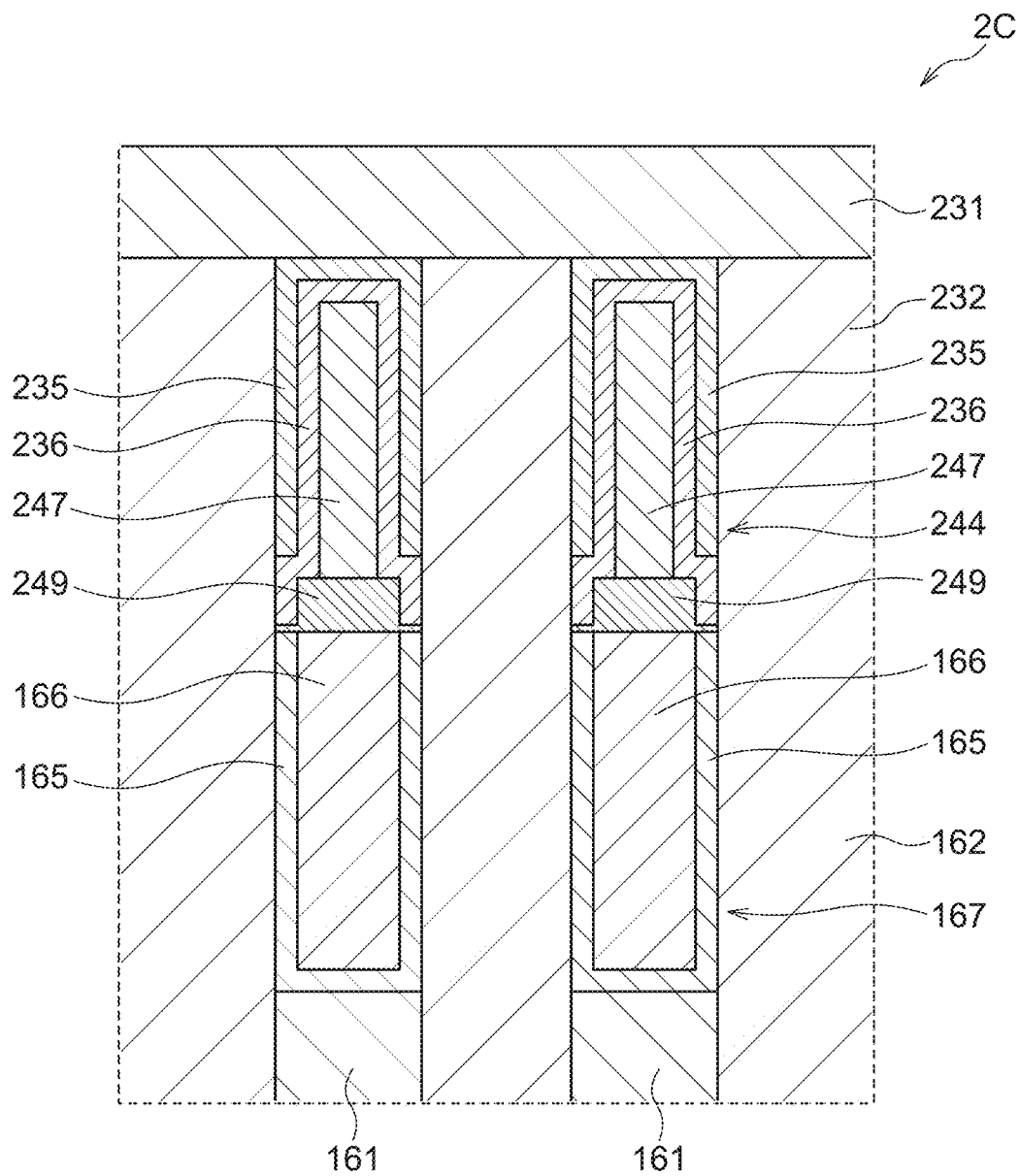

Next, FIGS. 23 to 25 will be referenced to describe a semiconductor device 2C according to the fifth embodiment and a method of forming the same.

First, a capacitor portion 240 will be described. As illustrated in FIG. 23, the capacitor portion 240 differs from the capacitor portion 230 according to the fourth embodiment in that a second lower electrode 247 is formed instead of the first lower electrode 237, and in that a silicon portion 248 is formed instead of the metal portion 238. The second lower electrode 247 includes metal, and contains ruthenium, for example. The silicon portion 248 contains silicon. The plug-shaped second lower electrode 247 is formed by depositing ruthenium by CVD, and then etching back the ruthenium.

The silicon portion 248 is formed by depositing silicon by CVD, and then etching back the silicon. The silicon portion 248 and the second lower electrode 247 contact each other. Through the above steps, the capacitor portion 240 is formed. The rest of the configuration is similar to the capacitor portion 230 according to the fourth embodiment.

Next, as illustrated in FIG. 24, the capacitor portion 240 is stacked onto the plug portion 160. The plug portion 160 and the capacitor portion 240 are bonded together by hybrid bonding. The capacitor portion 240 in FIG. 24 is illustrated in an upside-down state relative to the capacitor portion 240 illustrated in FIG. 23. The plug portion 160 has a configuration similar to the plug portion 160 in the fourth embodiment.

The plug portion 160 and the capacitor portion 240 contact each other at a bonding surface H, and are bonded together by hybrid bonding. At the bonding surface H, the silicon portion 248 and the metal 166 face opposite each other but do not make contact, and a gap 169 is formed in between.

Next, by annealing, the second lower electrode 247 of the capacitors 244 and the silicon portion 248 react to form a metal silicide portion 249 that contains ruthenium silicide, as illustrated in FIG. 25. The ruthenium and the silicon react, and the volume of the material expands when the ruthenium silicide is formed. For this reason, the generated ruthenium silicide fills the gap 169 to contact the plugs 167, thereby causing the second lower electrode 247 of the capacitors 244 and the plugs 167 to contact each other with the metal silicide portion 249 in between, and forming an electrical connection.

Through the above steps, the semiconductor device 2C according to the fifth embodiment is formed. The metal silicide portion 249 containing ruthenium silicide is interposed between the plate electrode 231 and the capacitive contacts 161, and connects the plate electrode 231 and the capacitive contacts 161. Ruthenium silicide is contained in at least a portion of the material between the plate electrode 231 and the capacitive contacts 161.

Figure 26:
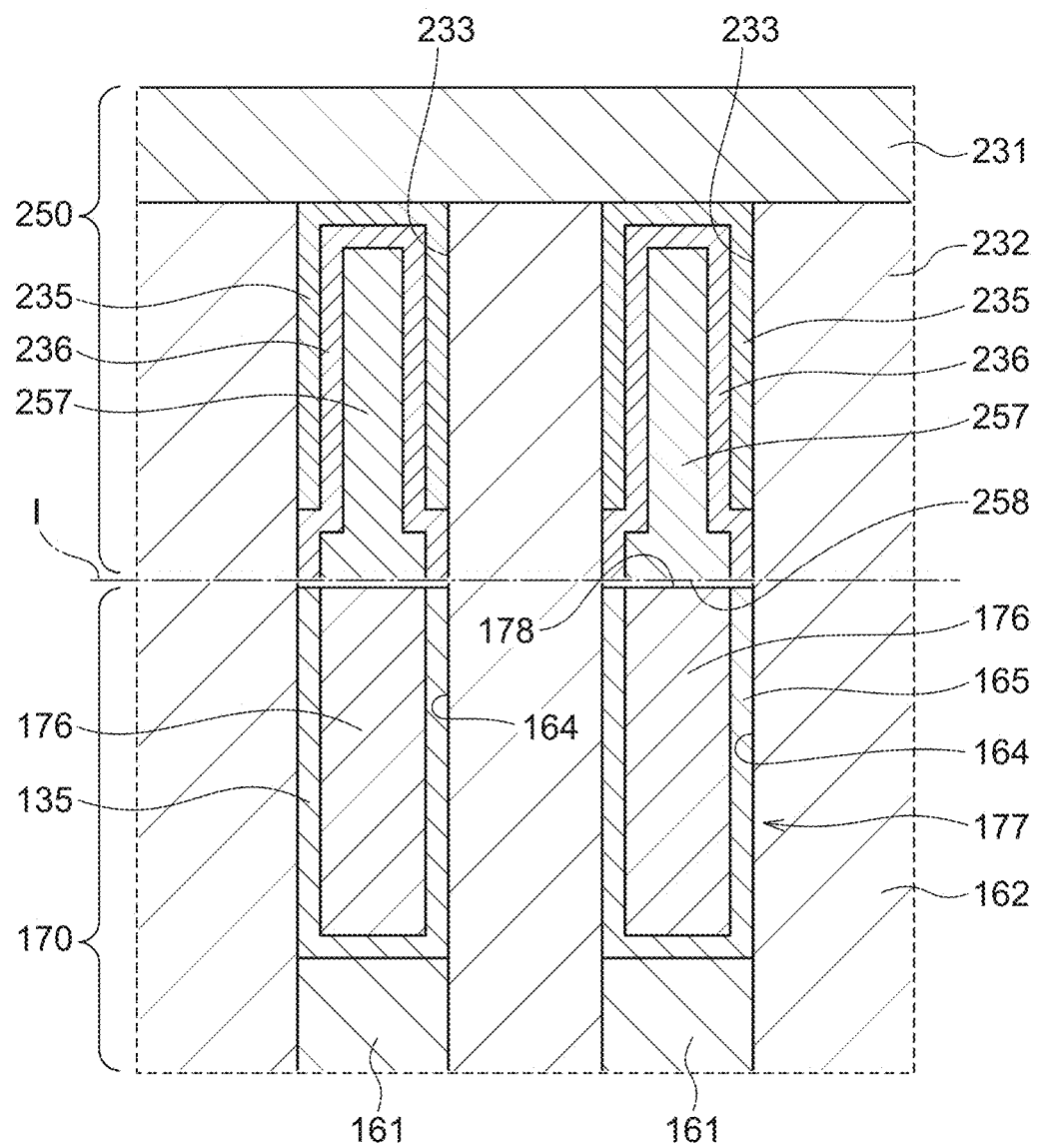
FIGS. 26 and 27 are diagrams illustrating a schematic configuration of the semiconductor device according to the sixth embodiment and a method of forming the same.
Figure 27:
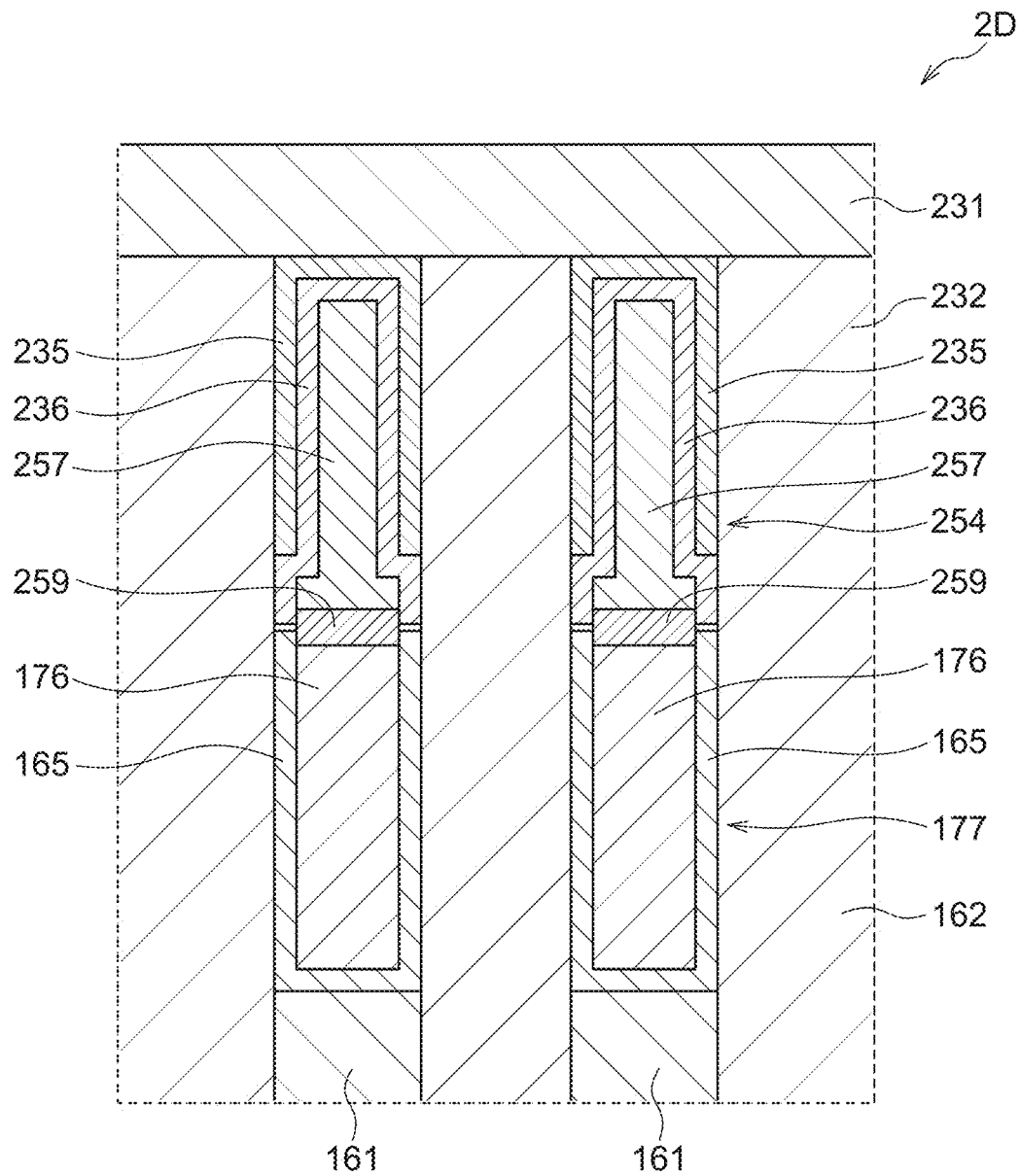

Next, FIGS. 26 and 27 will be referenced to describe a semiconductor device 2D according to the sixth embodiment and a method of forming the same.

In the sixth embodiment, the semiconductor device 2D includes a plug portion 170 and a capacitor portion 250. The semiconductor device 2D is formed by stacking and bonding the plug portion 170 and the capacitor portion 250 together by hybrid bonding.

The plug portion 170 according to the sixth embodiment is different from the plug portion 160 according to the fifth embodiment in that a silicon portion 176 containing silicon is formed instead of the metal 166 containing ruthenium. The rest of the configuration is the same as the plug portion 160 according to the fifth embodiment. The silicon portion 176 is formed by depositing silicon by CVD, and then etching back the silicon.

Also, the capacitor portion 250 according to the sixth embodiment is different from the capacitor portion 240 according to the fifth embodiment in that a metal portion 257 containing ruthenium is provided instead of the second lower electrode 247 and the silicon portion 248 provided in the capacitor portion 240. The rest of the configuration is the same as the capacitor portion 240 according to the fifth embodiment. The metal portion 257 is formed by depositing ruthenium by CVD, and then etching back the ruthenium.

As illustrated in FIG. 26, the plug portion 170 and the capacitor portion 250 contact each other at a bonding surface I, and are bonded together by hybrid bonding. At the bonding surface I, the metal portion 257 and the silicon portion 176 face opposite each other but do not make contact, and a gap is formed between a bottom face 258 of the metal portion 257 and a top face 178 of the silicon portion 176. Note that the size of this gap is set such that the metal portion 257 and the silicon portion 176 can come into contact with each other through the expansion of the metal portion 257.

Next, by annealing, the metal portion 257 of the capacitors 254 and the silicon portion 176 of the plug portion 170 react to form a metal silicide portion 259 that contains ruthenium silicide, as illustrated in FIG. 27. Note that ruthenium has a higher coefficient of expansion than silicon. The rise in temperature due to annealing causes the ruthenium contained in the metal portion 257 to expand, thereby causing the metal portion 257 and the silicon portion 176 to come into contact and produce a silicide reaction between the ruthenium and the silicon.

The ruthenium and the silicon react and expand as the ruthenium silicide is formed, and the volume of the material increases. For this reason, the generated metal silicide portion 259 fills the gap and unites with plugs 177. With this arrangement, the metal portion 257 of the capacitors 254 and the plugs 177 contact each other with the metal silicide portion 259 in between, and an electrical connection is formed.

Through the above steps, the semiconductor device 2D according to the sixth embodiment is formed. The metal silicide portion 259 containing ruthenium silicide is disposed between the plugs 177 and the capacitors 254. Ruthenium silicide is contained in at least a portion of the material between the plate electrode 231 and the capacitive contacts 161.

Seventh and Eighth Embodiments

Next, a semiconductor device 500 to which the seventh and eighth embodiments are applied will be described with reference to FIGS. 28 to 33. In the following description, DRAM is given as an example of the semiconductor device 500.

Figure 28:
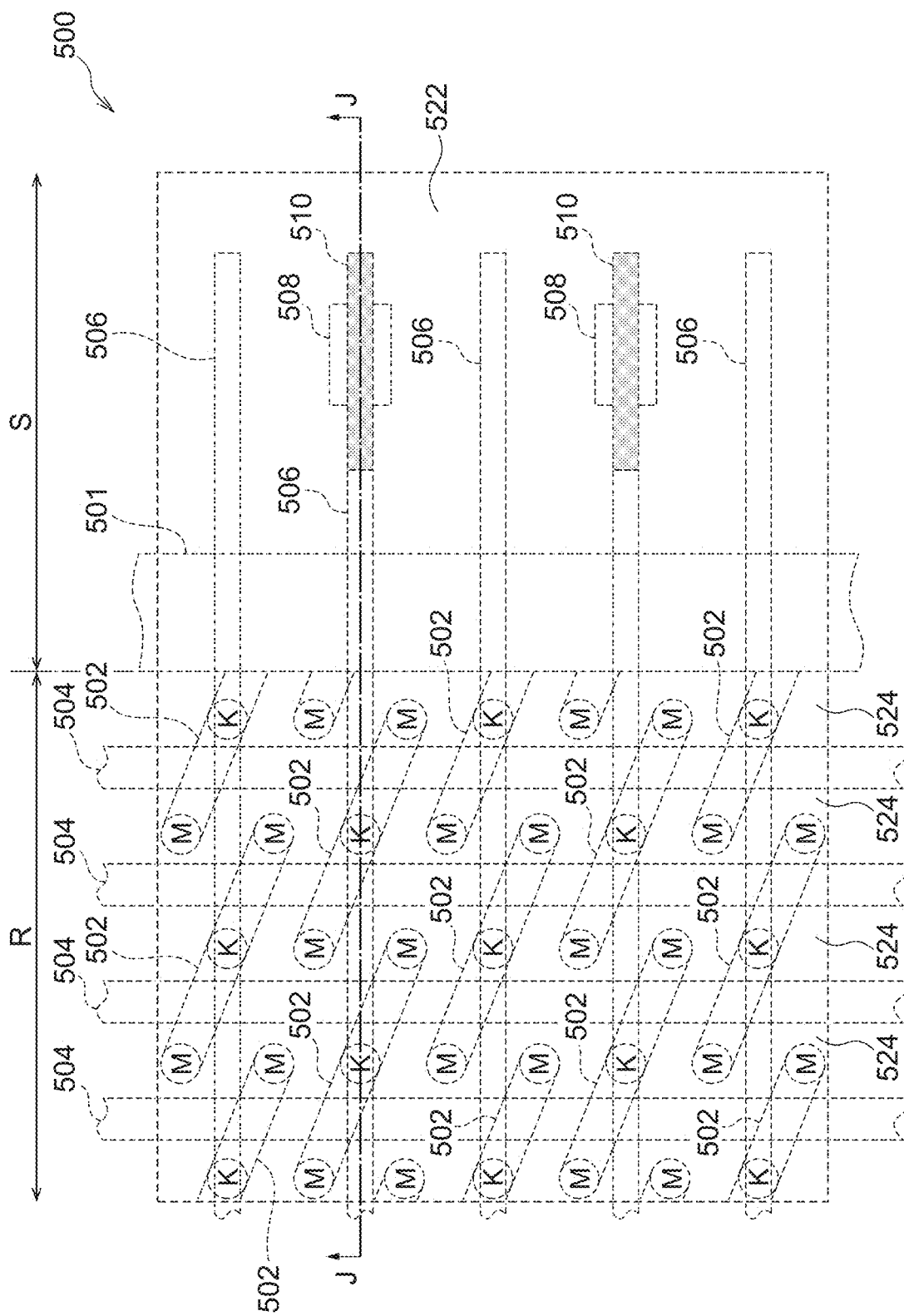
FIG. 28 is a diagram for explaining a semiconductor device according to seventh and eighth embodiments, and is a plan-view layout illustrating an example of a schematic configuration of a part of DRAM.

FIG. 28 is a plan-view layout illustrating a schematic configuration of one end portion of the memory cell area of DRAM. Note that the other end portion of the memory cell area has a configuration that is line-symmetric with the layout illustrated in FIG. 28. The configuration described in FIGS. 29 to 33 likewise applies to the configuration of the other end portion that is line-symmetric with the configuration illustrated in FIGS. 29 to 33.

FIG. 28 illustrates an example of a plan-view layout of a semiconductor device 3A according to the seventh embodiment and a semiconductor device 3B according to the eighth embodiment described later. As illustrated in FIG. 28, the semiconductor device 500 is provided with a memory cell portion R and a peripheral circuit portion S. In the peripheral circuit portion S, a silicon moat 501 is provided along the boundary with the memory cell portion R. The silicon moat 501 is provided to prevent crystal defects in the silicon.

In the memory cell portion R, a plurality of word lines 504 and a plurality of digit lines 506 are disposed orthogonally at equal pitch. Memory cells 502 that form DRAM memory cells are disposed at the intersection points between the word lines 504 and the digit lines 506. The memory cells 502 are demarcated by isolations 524.

The longitudinal direction of the memory cells 502 is inclined at a predetermined angle with respect to the digit lines 506. Each word line 504 functions as the gate electrode of an access transistor of a memory cell among the memory cells 502. The digit lines 506 are connected in a central portion of the memory cells 502 through a digit line contact K. In each memory cell 502, capacitive contacts M are disposed on the opposite side of the word lines 504 with respect to the digit line contact K. The lower electrode of a capacitor not illustrated that will be described later is connected to each capacitive contact M.

The digit lines 506 lead out from the peripheral circuit portion S, and a contact 508 electrically connected to one of the digit lines 506 is provided on every other digit line 506. The portion of a digit line 506 near a contact 508 is a ruthenium silicide portion 510. The ruthenium silicide portion 510 is connected to the digit line 506.

The ruthenium silicide portion 510 is interposed between the digit line 506 and the contact 508. The ruthenium silicide portion 510 functions as a part of a digit line of a semiconductor device 3A. These digit lines 506 and ruthenium silicide portions 510 are provided on an isolation 522 in the peripheral circuit portion S.

Figure 29:
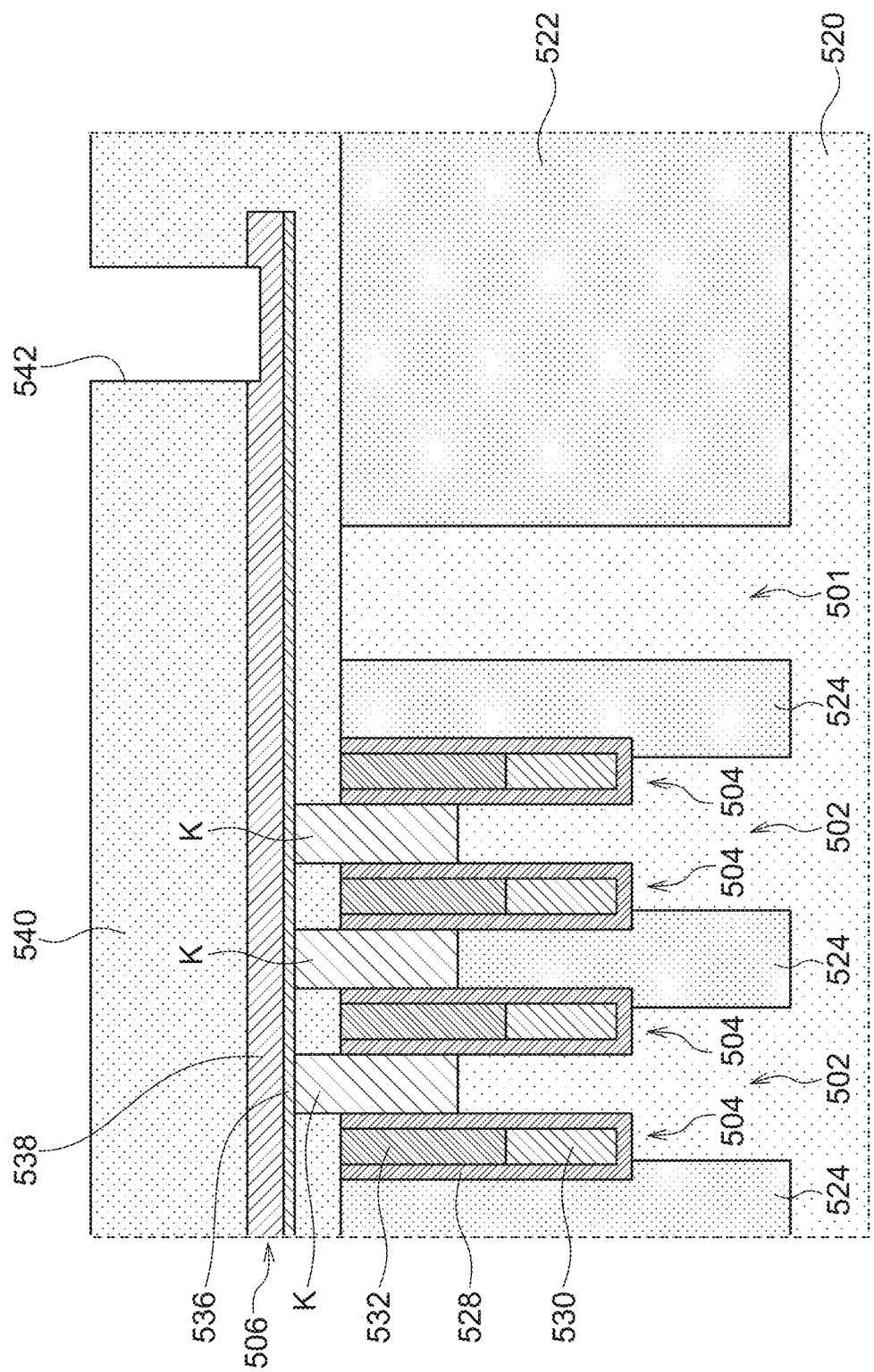
FIGS. 29 to 31 are diagrams illustrating a schematic configuration of the semiconductor device according to the seventh embodiment and a method of forming the same.
Figure 30:
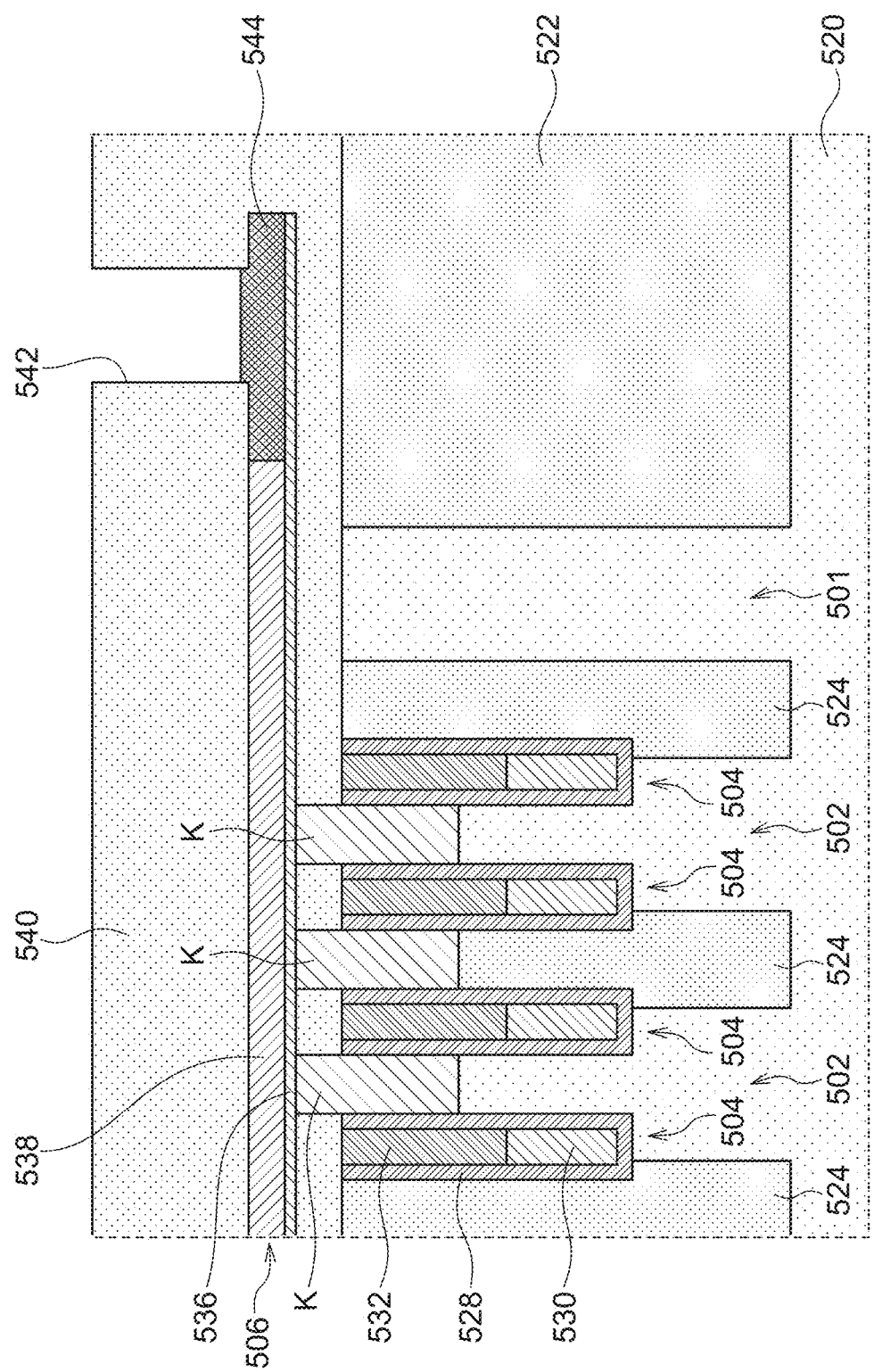
Figure 31:
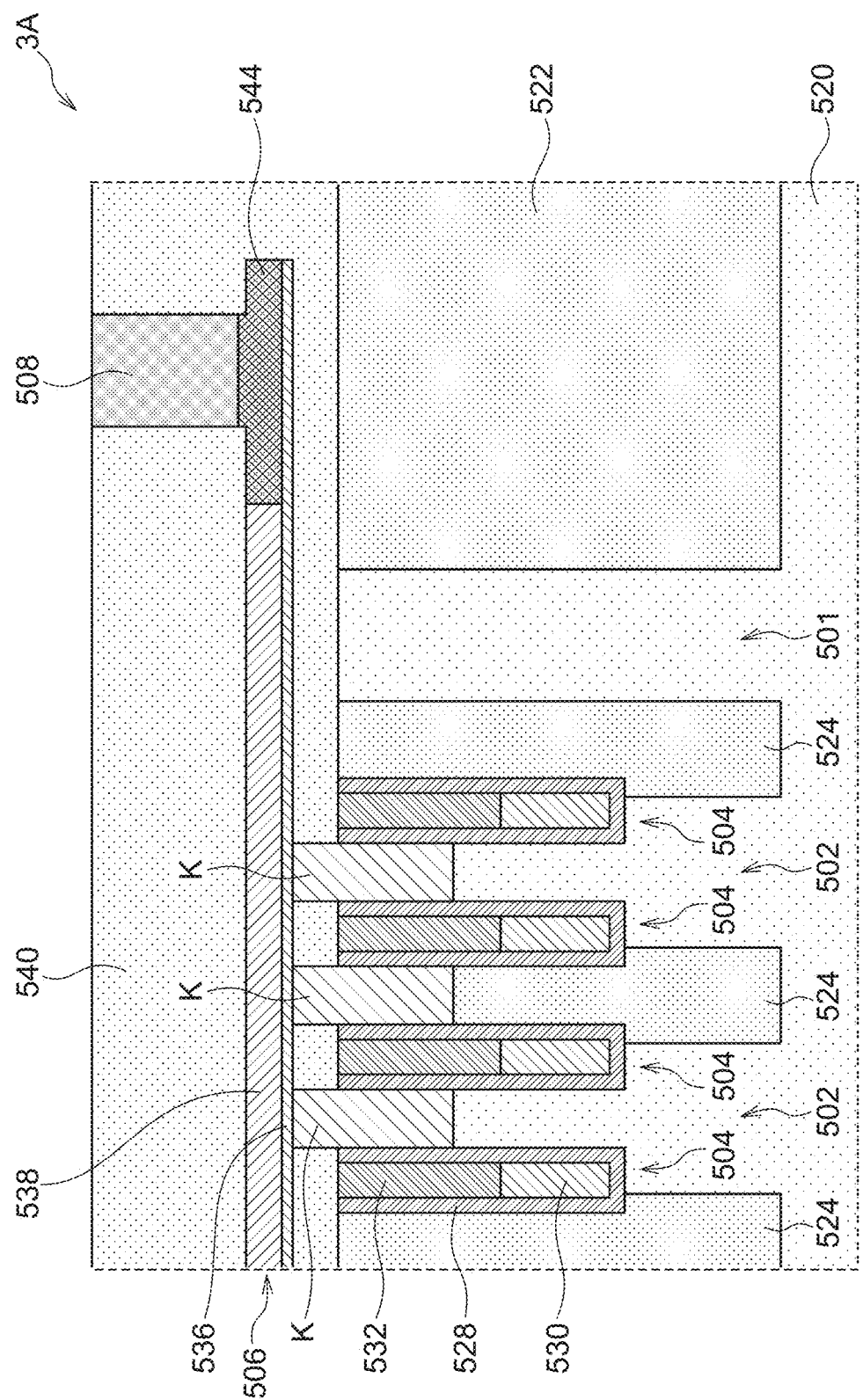

Next, FIGS. 29 to 31 will be referenced to describe the semiconductor device 3A according to the seventh embodiment and a method of forming the same. FIGS. 29 to 31 are longitudinal sections of the portion along the line J-J in FIG. 28, and are diagrams that sequentially illustrate an example of the schematic configuration in exemplary process stages of the semiconductor device 3A.

As illustrated in FIG. 29, the isolations 522 and 524 are formed on a semiconductor substrate 520. The silicon moat 501 and the memory cells 502 are demarcated by the isolations 522 and 524. The semiconductor substrate 520 contains single-crystal silicon. The isolations 522 and 524 contain an insulating material such as silicon dioxide, for example. The isolations 522 and 524 are formed by forming grooves in the semiconductor substrate 520, forming silicon dioxide by CVD, and then flattening the surface by chemical mechanical polishing (CMP) for example to embed the silicon dioxide into the grooves.

Furthermore, the word lines 504 are formed by forming grooves in the memory cells 502 and embedding a gate insulating film 528, a gate conductive material 530, and an insulating portion 532 into the grooves. The gate insulating film 528 contains an $5i1$ film or an SiON film. The gate conductive material 530 provided in each word line 504 contains a conductive material such as polysilicon, titanium nitride, or tungsten, for example. The insulating portion 532 contains an insulating material such as silicon nitride, for example. The gate insulating film 528, the gate conductive material 530, and the insulating portion 532 are embedded into the grooves formed in the memory cells 502 by being deposited by CVD and then being etched back.

Additionally, the digit line contacts K are formed in a central portion of the memory cells 502, and a digit line 506 with a multilayer structure containing a barrier metal 536 and a conductive material 538 is formed. The digit line contacts K contain polysilicon, for example. The polysilicon is embedded into contact holes by being deposited by CVD for example, and then being etched back.

The barrier metal 536 contains titanium nitride, for example. The conductive material 538 contains ruthenium, for example. Additionally, an interlayer insulating film 540 is formed to cover the barrier metal 536 and the conductive material 538. The interlayer insulating film 540 may also have a multilayer structure containing a plurality of insulating films. The barrier metal 536 and the conductive material 538 are deposited by physical vapor deposition (PVD), and then patterned by performing lithography and anisotropic dry etching.

The interlayer insulating film 540 contains silicon dioxide for example, and is deposited by CVD. Next, a contact hole 542 reaching from the top face of the interlayer insulating film 540 to the surface of the digit line 506 is formed. In the contact hole 542, the top face of the conductive material 538 of the digit line 506, or in other words the top face of the ruthenium, is exposed.

Next, as illustrated in FIG. 30, the semiconductor device 3A is placed in a reaction chamber not illustrated, dichlorosilane is introduced into the chamber, and the temperature is set to approximately 500 degrees Celsius or higher, or approximately 550 degrees Celsius or higher. Nitrogen ($N_2$) is used as a carrier gas for the dichlorosilane, for example. With this arrangement, the dichlorosilane acts on the ruthenium contained in the conductive material 538 exposed in the contact hole 542, the conductive material 538 changes to ruthenium silicide, and a ruthenium silicide portion 544 is formed. Note that in the silicidation of the ruthenium, a gas containing silane, disilane, monochlorosilane, trichlorosilane, or some other type of silicon may be used instead of dichlorosilane.

Next, as illustrated in FIG. 31, a conductive material is embedded in the contact hole 542 to form a contact 508. The contact 508 contains a conductive material such as tungsten, for example. The contact 508 is formed by depositing tungsten by CVD and then etching back the tungsten, for example. Through the above steps, the semiconductor device 3A is formed.

According to the semiconductor device 3A according to the seventh embodiment, the digit line 506 is connected to the ruthenium silicide portion 544. The ruthenium silicide portion 544 is interposed between the contact 508 and the digit, line 506. By causing the ruthenium exposed in the contact hole 542 to change into ruthenium silicide in advance, it is possible to avoid a situation in which the ruthenium aggregates during the heat treatment performed after forming the contact hole 542, thereby forming a gap in the digit line 506 and causing a discontinuity.

Figure 32:
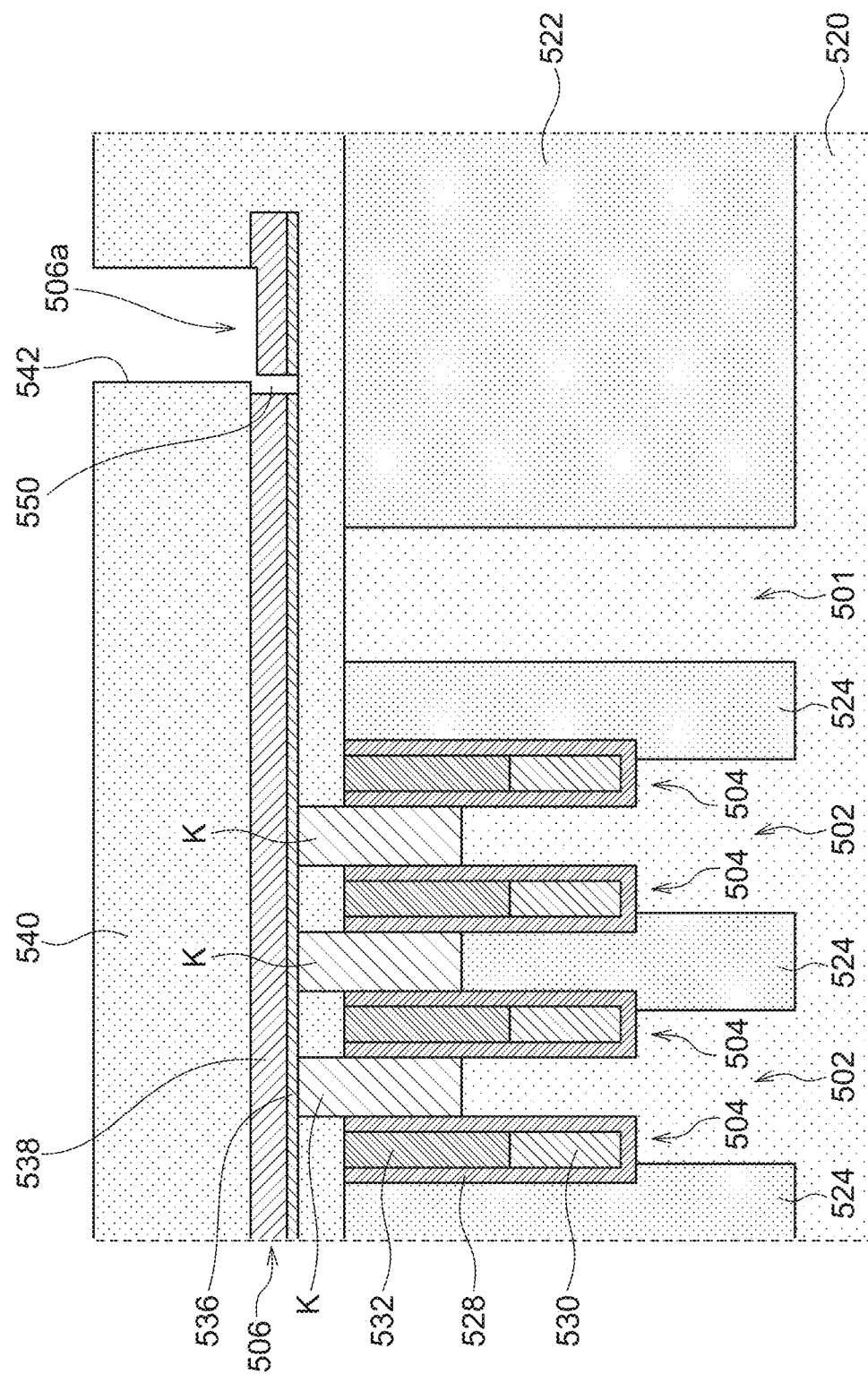
FIGS. 32 and 33 are diagrams illustrating a schematic configuration of the semiconductor device according to the eighth embodiment and a method of forming the same.
Figure 33:
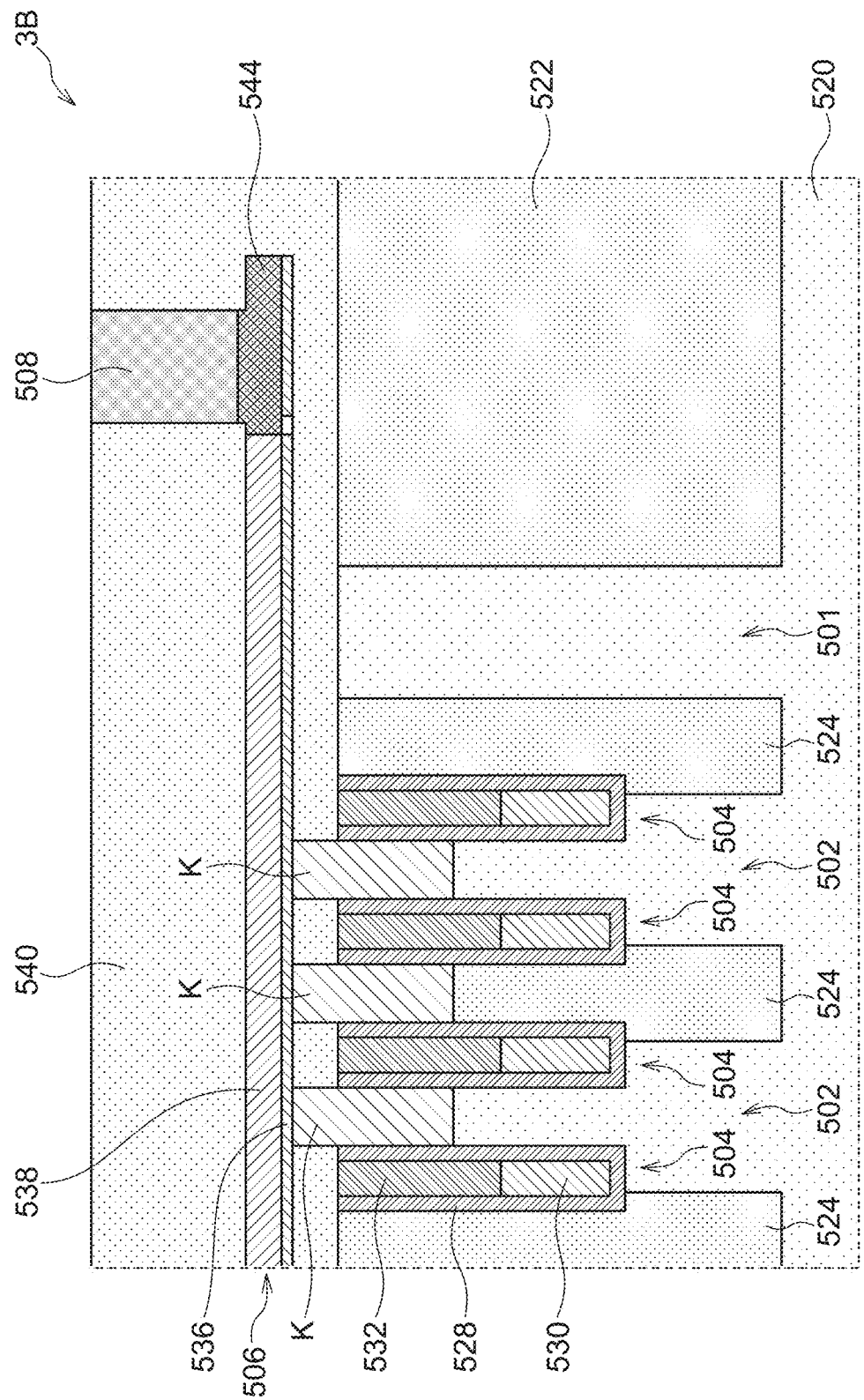

Next, FIGS. 29, 32, and 33 will be referenced to describe a semiconductor device 3B according to the eighth embodiment and a method of forming the same. The plan-view configurations of FIGS. 29, 32, and 33 are similar to the layout illustrated in FIG. 28. FIGS. 29, 32, and 33 are longitudinal sections of the portion along the line J-J in FIG. 28, and are diagrams that sequentially illustrate an example of the schematic configuration in exemplary process stages of the semiconductor device 3B.

First, steps similar to the steps performed in FIG. 29 according to the seventh embodiment are performed.

Next, as illustrated in FIG. 32, annealing is performed by rapid thermal annealing (RTA), for example. The ruthenium in an exposed portion 506a of the digit line 506 exposed in the contact hole 542 aggregates, and a gap 550 is formed near the exposed portion 506a. The stress due to the aggregation of the conductive material 538 containing ruthenium causes the gap 550 to be formed even in the barrier metal 536. Consequently, a discontinuity in the digit line 506 occurs at the gap 550. In the contact hole 542, the top face of the conductive material 538 of the digit line 506, or in other words the top face of the ruthenium, is exposed.

Next, as illustrated in FIG. 33, the semiconductor device 3B is placed in a reaction chamber not illustrated, dichlorosilane is introduced into the chamber, and the temperature is set to approximately 500 degrees Celsius or higher, or approximately 550 degrees Celsius or higher. Nitrogen is used as a carrier gas for the dichlorosilane, for example. With this arrangement, the dichlorosilane acts on the ruthenium contained in the conductive material 538 exposed in the contact hole 542, the conductive material 538 changes to ruthenium silicide, and a ruthenium silicide portion 544 is formed. Because the conductive material 538 expands when the conductive material 538 changes to ruthenium silicide and the volume of the material increase, the gap 550 is filled by the ruthenium silicide, and the discontinuity in the digit line 506 is reconnected. Note that in the silicidation of the ruthenium, a gas containing silane, disilane, monochlorosilane, trichlorosilane, or some other type of silicon may be used instead of dichlorosilane.

Next, a conductive material is embedded in the contact hole 542 to form a contact 508. The contact 508 contains a conductive material such as tungsten, for example. Through the above steps, the semiconductor device 3B is formed. The semiconductor device 3B according to the eighth embodiment has a configuration that is substantially similar to the semiconductor device 3A according to the seventh embodiment.

According to the semiconductor device 3B according to the eighth embodiment, effects similar to the seventh embodiment are obtained. In addition, even if a discontinuity occurs in the digit line 506 due to the formation of the gap 550 near the exposed portion 506a of the digit line 506 exposed in the contact hole 542, the discontinuity can be reconnected with a relatively simple process.

As above, DRAM is described as an example of the semiconductor device according to various embodiments, but the above description is merely one example and not intended to be limited to DRAM. Memory devices other than DRAM, for example, memory devices such as static random-access memory (SRAM), flash memory, erasable programmable read-only memory (EPROM), magnetoresistive random-access memory (MRAM), and phase-change memory can also be applied as the semiconductor device. Furthermore, devices other than memory, including logic ICs such as a microprocessor and an application-specific integrated circuit (ASIC) for example are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method for forming a multilayer conductive structure, comprising:
    forming a first conductive portion;
    forming a second conductive portion containing ruthenium (Ru) therein on the first conductive portion;
    forming a silicon portion contacting the Ru of the second conductive portion;
    forming a third conductive portion on the second conductive portion; and
    performing a silicidation process on the second conductive portion.

2. A method for forming a multilayer conductive structure, comprising:
    forming a first conductive portion;
    forming a second conductive portion containing ruthenium (Ru) therein on the first conductive portion;
    forming a third conductive portion on the second conductive portion;
    performing a silicidation process on the second conductive portion; and
    providing a gap between the second conductive portion and the third conductive portion.

3. The method of claim 2, further comprising:
    filling the gap by expansion of ruthenium silicide formed by the silicidation.

4. The method of claim 2, further comprising:
    connecting the second conductive portion and the third conductive portion by filling the gap with ruthenium silicide formed by the silicidation.

5. The method of claim 2, further comprising:
    performing heat treatment at about 400 degrees Celsius or higher in the silicidation process.

6. A method for forming a multilayer conductive structure, comprising:
    forming a first conductive portion;
    forming a second conductive portion containing ruthenium (Ru) therein on the first conductive portion;
    forming a third conductive portion on the second conductive portion;
    performing a silicidation process on the second conductive portion; and
    forming a silicon portion in the third conductive portion.

7. The method of claim 6, further comprising:
    providing a gap between the second conductive portion and the silicon portion in the third conductive portion.

8. The method of claim 7, further comprising:
    filling the gap by expansion of ruthenium silicide formed by the silicidation.

9. The method of claim 6, further comprising:
    performing heat treatment at about 400 degrees Celsius or higher in the silicidation process.

10. The method of claim 1,
    wherein the silicidation process includes introducing a silicon-containing gas and performing heat treatment at about 500 degrees Celsius or higher.

11. A method for forming a multilayer conductive structure, comprising:
    forming a first conductive portion;
    forming a second conductive portion containing ruthenium (Ru) therein on the first conductive portion;
    forming a third conductive portion on the second conductive portion; and
    performing a silicidation process on the second conductive portion,
    wherein the silicidation process includes introducing a dichlorosilane gas and performing heat treatment at about 500 degrees Celsius or higher.

12. A method comprising:
    forming a first conductive portion containing ruthenium (Ru) therein;
    forming an insulating film covering the first conductive portion;
    forming a contact hole exposing a part of the first conductive portion;
    forming a gap in the first conductive portion near the contact hole; and
    performing a silicidation process on the first conductive portion through the contact hole.

13. The method of claim 12,
    wherein the silicidation process includes introducing a silicon-containing gas.

14. A method comprising:
    forming a first conductive portion containing ruthenium (Ru) therein;
    forming an insulating film covering the first conductive portion;
    forming a contact hole exposing a part of the first conductive portion; and
    performing a silicidation process on the first conductive portion through the contact hole,
    wherein the silicidation process includes introducing a dichlorosilane gas.

15. The method of claim 12,
    wherein the silicidation process includes performing heat treatment at about 500 degrees Celsius or higher.

16. The method of claim 14, further comprising:
    forming a gap in the first conductive portion near the contact hole.

17. The method of claim 16,
wherein the gap is formed by annealing performed after forming the contact hole.

18. An apparatus comprising:
a first portion including a conductive material;
a second portion including a conductive material; and
a third portion between the first portion and the second portion,
wherein the third portion contains ruthenium (Ru),
wherein a silicon portion contacts the Ru of the third portion, and
wherein the third portion includes ruthenium silicide which is formed by silicidizing the Ru at least in part therein.

19. The apparatus of claim 18,
wherein all of the third portion includes ruthenium silicide.

\* \* \* \* \*